US012787786B2

(12) United States Patent
Kim et al.

(10) Patent No.: US 12,787,786 B2
(45) Date of Patent: Nov. 3, 2026

(54) CHIP ON FILM PACKAGE

(71) Applicant: Samsung Display Co., LTD., Yongin-si (KR)

(72) Inventors: Wontae Kim, Yongin-si (KR); Jae-Han Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 342 days.

(21) Appl. No.: 18/522,225

(22) Filed: Nov. 29, 2023

(65) Prior Publication Data

US 2024/0282717 A1 Aug. 22, 2024

(30) Foreign Application Priority Data

Feb. 16, 2023 (KR) ........................ 10-2023-0020835

(51) Int. Cl.

| | |
|---|---|
| ***H10W 40/22*** | (2026.01) |
| ***G09G 3/20*** | (2006.01) |
| ***H10K 59/90*** | (2026.01) |
| ***H10W 40/10*** | (2026.01) |
| ***H10W 42/00*** | (2026.01) |

(Continued)

(52) U.S. Cl.

CPC ....... *H10W 42/121* (2026.01); *H10W 70/688* (2026.01); *H10K 59/90* (2023.02); *H10W 90/00* (2026.01); *H10W 90/724* (2026.01)

(58) Field of Classification Search

CPC . H10W 90/00; H10W 90/724; H10W 90/701; H10W 90/736; H10W 90/794; H10W 72/20; H10W 72/30; H10W 72/321; H10W 72/354; H10W 72/874; H10W 72/071; H10W 72/073; H10W 72/07352; H10W 70/688; H10W 70/65; H10W 70/682; H10W 40/22; H10W 40/10; H10W 40/226; H10W 40/255; H10W 40/258; H05K 7/20472; H05K 7/20954; G09G 3/2092; G09G 3/20; G02F 1/13452; H10K 59/90

See application file for complete search history.

(56) References Cited

U.S. PATENT DOCUMENTS

| | | | | |
|---|---|---|---|---|
| 10,446,465 | B2 | 10/2019 | Kim et al. | |
| 2016/0066409 | A1* | 3/2016 | Kwon | ............... G02F 1/133305 174/254 |

(Continued)

FOREIGN PATENT DOCUMENTS

| | | |
|---|---|---|
| KR | 10-0658442 | 12/2006 |
| KR | 10-2018-0064583 | 6/2018 |
| KR | 10-2021-0112432 | 9/2021 |

*Primary Examiner* — Omar F Mojaddedi
(74) *Attorney, Agent, or Firm* — Lerner David LLP

(57) ABSTRACT

A chip on film package includes a base substrate including a driving chip area including a first side and a second side facing the first side, first areas covering ends of the first side of the driving chip area and including first bent portions, and a second area covering the second side of the driving chip area, a driving chip disposed on a first surface of the base substrate in the driving chip area, output lines electrically connected to the driving chip and disposed on the first surface of the base substrate in the first areas and the second area, and an adhesive member disposed on the base substrate and overlapping an entirety of the first areas and an entirety of the driving chip area in a plan view.

12 Claims, 19 Drawing Sheets

(51) Int. Cl.
*H10W 70/67* (2026.01)
*H10W 72/20* (2026.01)
*H10W 90/00* (2026.01)

(56) References Cited

U.S. PATENT DOCUMENTS

2017/0047547 A1* 2/2017 Son ...................... H10K 59/131
2018/0158750 A1* 6/2018 Kim ......................... G09G 3/20
2019/0102027 A1* 4/2019 Yoo ....................... G06F 3/0445
2020/0077518 A1* 3/2020 Kim ...................... G02F 1/1345
2023/0005893 A1* 1/2023 Jeon .................. G06V 40/1306

* cited by examiner

CHIP ON FILM PACKAGE

CROSS-REFERENCE TO RELATED APPLICATION

This application claims priority to and benefits of Korean Patent Application No. 10-2023-0020835 under 35 U.S.C. § 119, filed on Feb. 16, 2023, in the Korean Intellectual Property Office (KIPO), the content of which is incorporated herein by reference in its entirely.

BACKGROUND

1. Technical Field

The disclosure relates to a chip on film package. More particularly, the disclosure relates to a chip on film package including an adhesive member.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display device ("PDP"), quantum dot display device or the like is increasing.

A display panel included in a display device may receive a scan signal, a data signal, or the like from an external device to display an image. In this case, the display panel and the external device may be connected through a flexible circuit board (e.g., a chip on film). In order to reduce the dead space of the display panel, the external device may be positioned on a rear surface of the display panel, which is a non-display area (e.g., in case that an image is displayed on a front surface of the display panel). For example, a chip on film may be bent to place the external device on the rear surface of the display panel. In this case, stress is concentrated on a part of the chip on film, and lines disposed on the chip on film may be disconnected.

SUMMARY

Embodiments provide a chip on film package that prevents lines from being short-circuited.

The technical objectives to be achieved by the disclosure are not limited to those described herein, and other technical objectives that are not mentioned herein would be clearly understood by a person skilled in the art from the description of the disclosure.

A chip on film package according to an embodiment of the disclosure includes a base substrate including a driving chip area including a first side extending in a first direction and a second side facing the first side and extending in the first direction, first areas covering ends of the first side of the driving chip area, spaced apart from each other in the first direction, and including a plurality of first bent portions, and a second area covering the second side of the driving chip area and adjacent to each of the first areas in a second direction intersecting the first direction, a driving chip disposed on a first surface of the base substrate in the driving chip area, a plurality of output lines electrically connected to the driving chip and disposed on the first surface of the base substrate in the first areas and the second area, and an adhesive member disposed on the base substrate and overlapping an entirety of the first areas and an entirety of the driving chip area in a plan view.

In an embodiment, the adhesive member may be disposed on a second surface, opposite to the first surface, of the base substrate.

In an embodiment, the adhesive member may include a plurality of second bent portions overlapping an entirety of the plurality of first bent portions in the plan view.

In an embodiment, the adhesive member may include a curved portion overlapping an entirety of the plurality of first bent portions in the plan view.

In an embodiment, the base substrate may further include a third area adjacent to the first side of the driving chip area between the first areas and fourth areas respectively positioned on both sides of the third area and spaced apart from each other in the first direction.

In an embodiment, the base substrate may further include dummy areas respectively positioned between the first areas and the fourth areas in the plan view and spaced apart from each other in the first direction. The plurality of output lines may be spaced apart from the dummy areas in the plan view.

In an embodiment, the chip on film package may further include a plurality of input lines electrically connected to the driving chip and disposed on the first surface of the base substrate in the third area, and a plurality of gate lines spaced apart from the driving chip and disposed on the first surface of the base substrate in each of the fourth areas. The plurality of gate lines may bypass the plurality of output lines.

In an embodiment, the adhesive member may at least partially overlap the plurality of input lines in the third area in the plan view.

In an embodiment, the adhesive member may be disposed on the first surface of the base substrate.

In an embodiment, the adhesive member may include an opening exposing the driving chip in the driving chip area.

In an embodiment, the adhesive member may overlap a part of the second area in the plan view.

In an embodiment, the adhesive member may have an asymmetrical shape with respect to the first side of the driving chip area.

A chip on film package according to another embodiment of the disclosure includes a base substrate including a driving chip area including a first side extending in a first direction and a second side facing the first side and extending in the first direction, first areas covering ends of the first side of the driving chip area, spaced apart from each other in the first direction, and including a first curved portion, and a second area covering the second side of the driving chip area and adjacent to each of the first areas in a second direction intersecting the first direction, a driving chip disposed on a first surface of the base substrate in the driving chip area, a plurality of output lines electrically connected to the driving chip and disposed on the first surface of the base substrate in the first areas and the second area, and an adhesive member disposed on the base substrate and overlapping an entirety of the first areas and an entirety of the driving chip area in a plan view.

In an embodiment, the adhesive member may be disposed on a second surface, opposite to the first surface, of the base substrate.

In an embodiment, the adhesive member may include a second curved portion overlapping an entirety of the first curved portion in the plan view.

In an embodiment, the adhesive member may be disposed on the first surface of the base substrate.

In an embodiment, the adhesive member may include an opening exposing the driving chip in the driving chip area.

In an embodiment, the chip on film package may further include a plurality of input lines electrically connected to the driving chip and a plurality of gate lines spaced apart from the driving chip. The base substrate may further include a third area adjacent to the first side of the driving chip area between the first areas and fourth areas respectively positioned on sides of the third area and spaced apart from each other in the first direction. The plurality of input lines may be disposed on the first surface of the base substrate in the third area. The plurality of gate lines may be disposed on the first surface of the base substrate in each of the fourth areas and may bypass the plurality of output lines.

In an embodiment, the base substrate may further include dummy areas respectively positioned between the first areas and the fourth areas in the plan view and spaced apart from each other in the first direction. The plurality of output lines may be spaced apart from the dummy areas in the plan view.

In an embodiment, the adhesive member may at least partially overlap the plurality of input lines in the third area in the plan view.

A chip on film package according to embodiments of the disclosure may include a base substrate including first areas each including a plurality of first bent portions and dummy areas respectively adjacent to the first areas, output lines disposed on the base substrate in the first areas, and an adhesive member disposed on the base substrate and overlapping an entirety of the first areas in a plan view.

Accordingly, stress applied to the output lines disposed on the base substrate in the first areas may be dispersed. For example, a line short-circuited of the chip on film package may not occur.

As the base substrate includes the dummy areas respectively adjacent to the first areas, some of the stress may be dispersed to the dummy areas where no lines are disposed. Accordingly, technical problems including a problem in which other lines are damaged by the dispersed stress, may be resolved.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
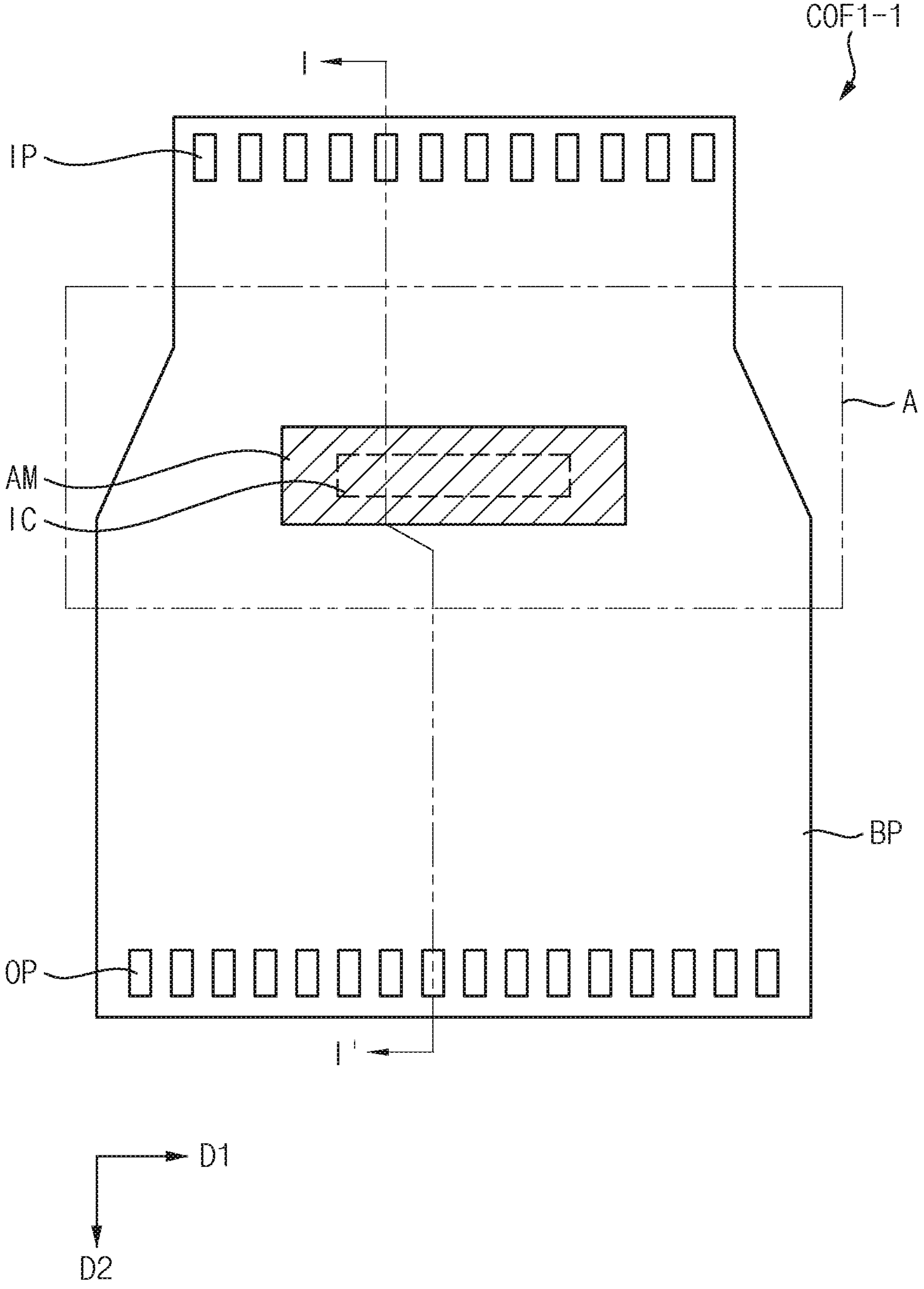
FIG. 1 is a schematic plan view illustrating a chip on film package according to an embodiment of the disclosure.

Hereinafter, embodiments of the disclosure will be described in detail with reference to the accompanying drawings. The same reference numerals are used for the same components in the drawings, and redundant descriptions of the same components will be omitted.

When an element is referred to as being "on," "connected to," or "coupled to" another element, it may be directly on, connected to, or coupled to the other element or intervening elements or layers may be present. When, however, an element is referred to as being "directly on," "directly connected to," or "directly coupled to" another element, there are no intervening elements or layers present. To this end, the term "connected" may refer to physical, electrical, and/or fluid connection, with or without intervening elements.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
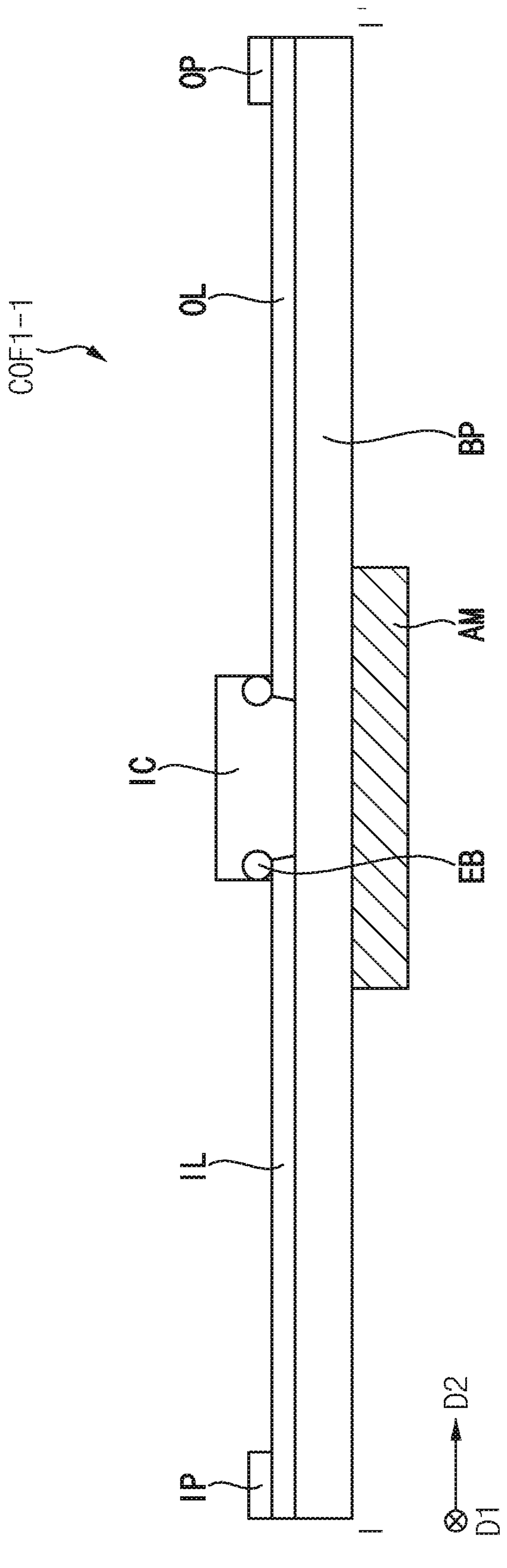
FIG. 2 is a schematic cross-sectional view taken along line I-I' of FIG. 1.
Figure 3:
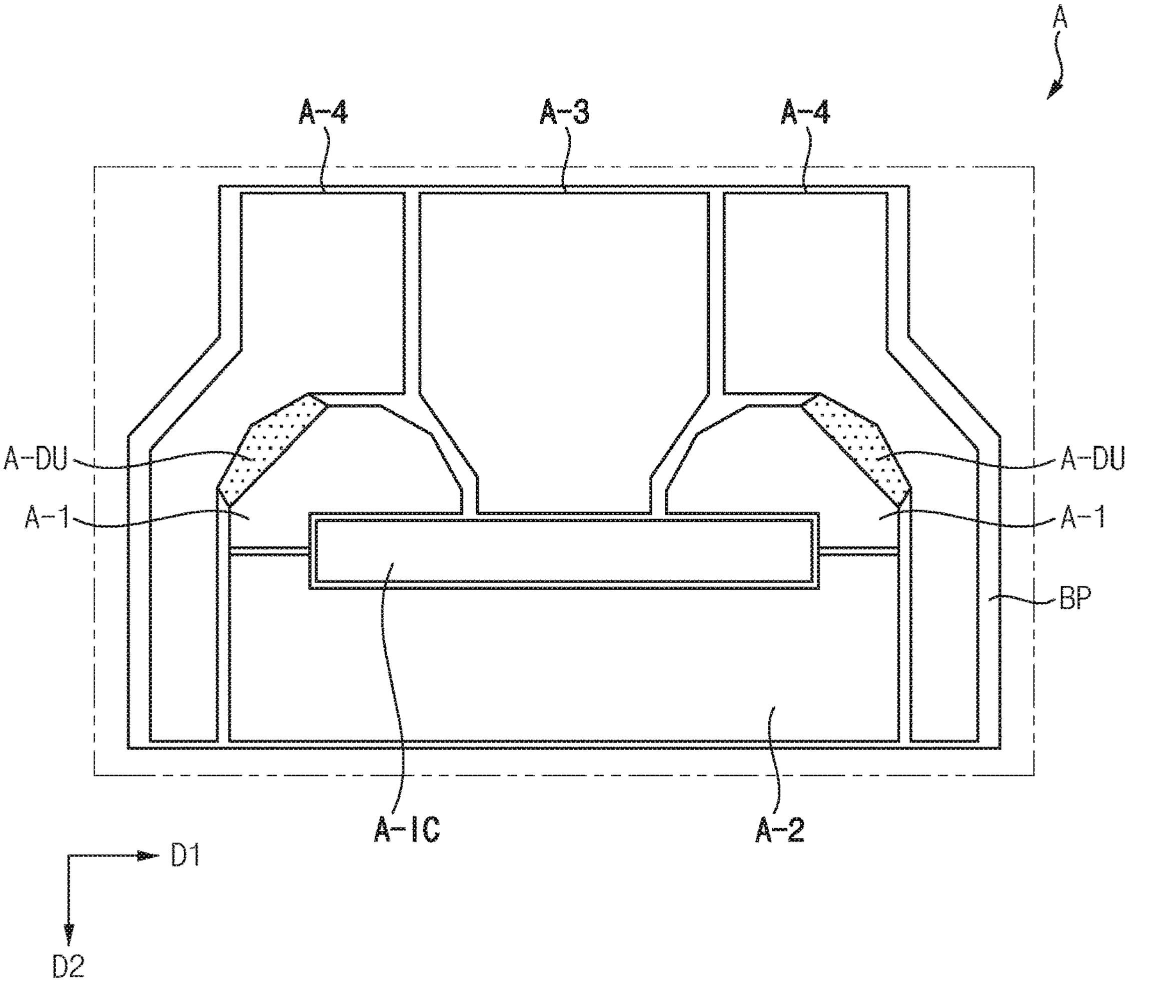
FIG. 3 is a schematic enlarged plan view of area A of FIG. 1.
Figure 4:
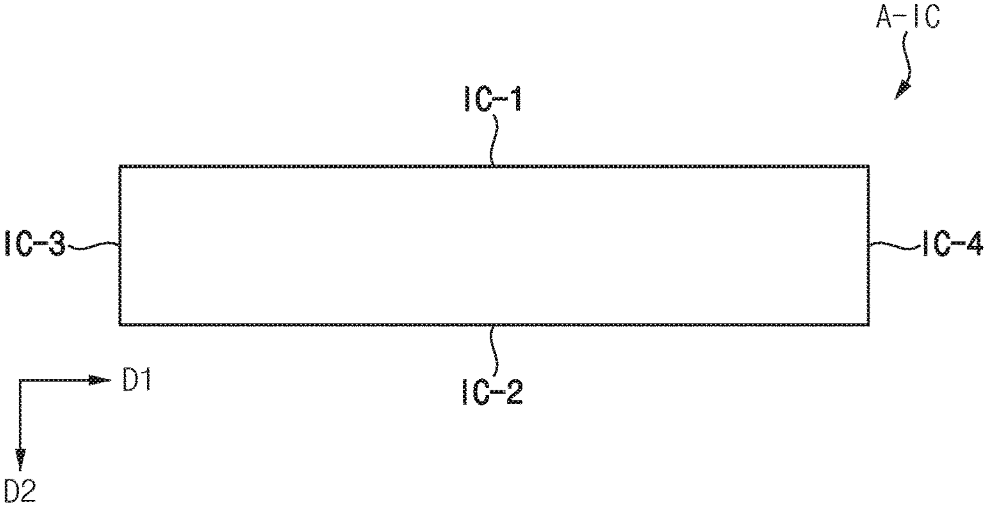
FIG. 4 is a schematic plan view illustrating a driving chip area of a base substrate of FIG. 3.
Figure 5:
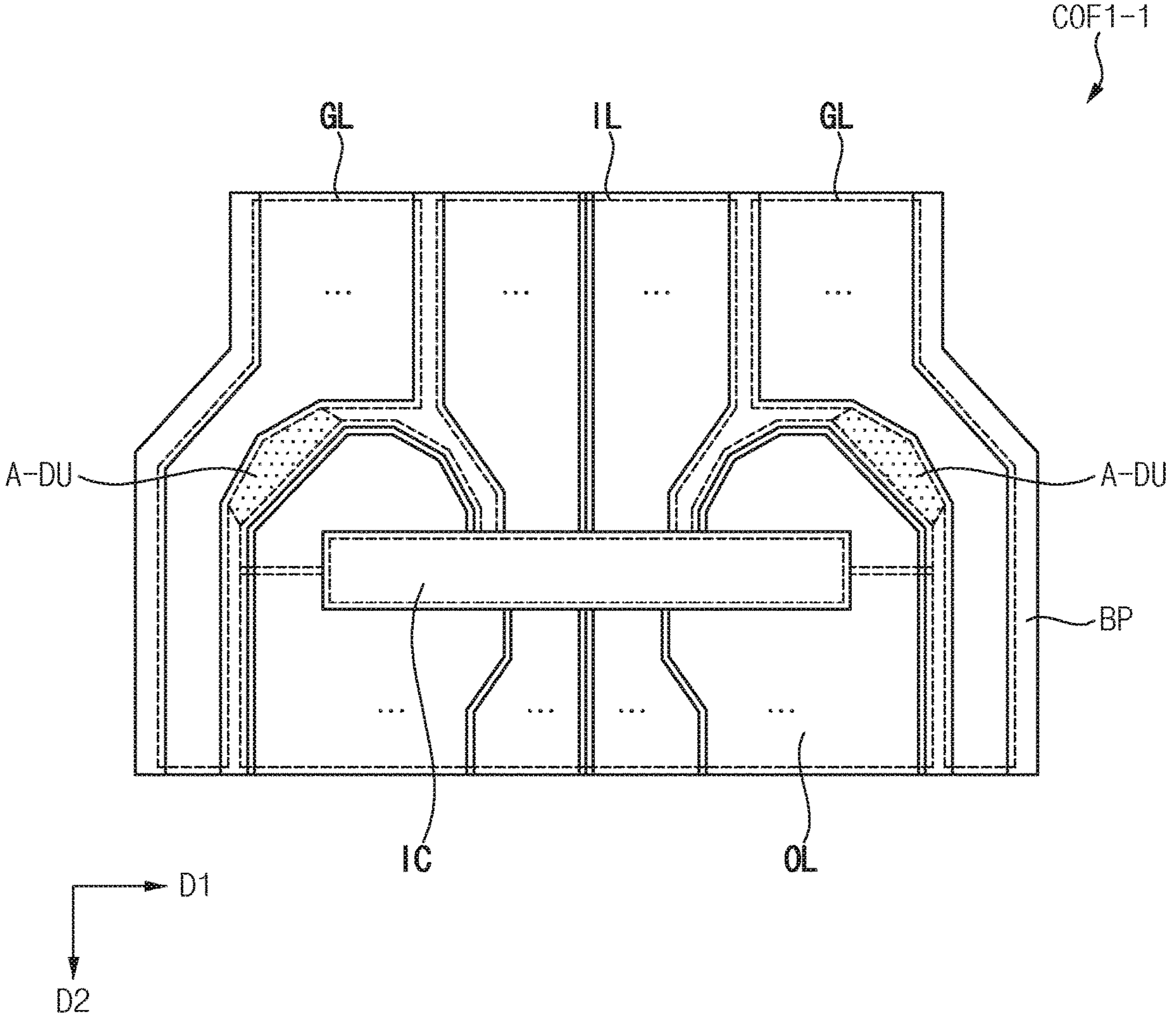
FIGS. 5 and 6 are schematic plan views illustrating the chip on film package of FIG. 1.

FIG. 1 is a schematic plan view illustrating a chip on film package according to an embodiment of the disclosure. FIG. 2 is a schematic cross-sectional view taken along line I-I' of FIG. 1. FIG. 3 is a schematic enlarged plan view of area A of FIG. 1. For example, FIG. 3 is a plan view illustrating areas of a base substrate BP included in a chip on film package COF1-1. FIG. 4 is a schematic plan view illustrating a driving chip area of a base substrate of FIG. 3. FIG. 5 is a schematic plan view illustrating the chip on film package of FIG. 1. For example, FIG. 5 is a plan view for describing lines disposed on the base substrate BP.

In this specification, a plane may be defined by a first direction D1 and a second direction D2 intersecting the first direction D1. For example, the first direction D1 and the second direction D2 may be perpendicular to each other.

Referring to FIGS. 1 and 2, the chip on film package COF1-1 may include the base substrate BP, a driving chip IC, input pad electrodes IP, output pad electrodes OP, input lines IL, output lines OL, an electrode bump EB, and/or an adhesive member AM.

The base substrate BP may include a various material such as a transparent material, semi-transparent material, or an opaque material. The base substrate BP may include a flexible film including a flexible material. For example, the base substrate BP may include a polyimide resin, a polyester resin, etc.

Referring further to FIGS. 3 and 4, the driving chip IC may be disposed on the base substrate BP in a driving chip area A-IC. Specifically, the driving chip IC may be disposed on a first surface of the base substrate BP in the driving chip area A-IC. The driving chip IC may receive an input signal and a driving IC power supply voltage from a device (e.g., an external device CON of FIG. 19). The driving chip IC may provide an output signal to a display panel (e.g., a display panel DP of FIG. 19) based on the input signal. Accordingly, the driving chip IC may control driving of the display panel.

The driving chip area A-IC may include a first side IC-1, a second side IC-2, a third side IC-3, and/or a fourth side IC-4. The first side IC-1 may extend in the first direction D1 parallel to an upper surface of the base substrate BP. The second side IC-2 may face the first side IC-1 and may extend in the first direction D1. The third side IC-3 may contact the first side IC-1 and the second side IC-2, respectively, and may extend in the second direction D2 parallel to the upper surface of the base substrate BP. The fourth side IC-4 may contact each of the first side IC-1 and the second side IC-2 and may extend in the second direction D2. In other words, the fourth side IC-4 may face the third side IC-3. In an embodiment, a length of each of the first and second sides IC-1 and IC-2 may be greater than a length of each of the third and fourth sides IC-3 and IC-4.

The base substrate BP may include first areas A-1, a second area A-2, a third area A-3, fourth areas A-4, dummy areas A-DU, and/or the driving chip area A-IC.

The driving chip area A-IC may be positioned in the center of the base substrate BP. The first areas A-1 may cover ends or both ends of the first side IC-1 of the driving chip area A-IC and may be spaced apart from each other in the first direction D1. For example, the both ends of the first side IC-1 may be portions adjacent to the third and fourth sides IC-3 and IC-4, respectively. In an embodiment, each of the first areas A-1 may have a polygonal shape. For example, each of the first areas A-1 may include first bent portions. Each of the first bent portions may have a diagonal shape extending in different directions.

The second area A-2 may be adjacent to the driving chip area A-IC in the second direction D2. Specifically, the second area A-2 may cover the second side IC-2 of the driving chip area A-IC. The second area A-2 may be adjacent to each of the first areas A-1 in the second direction D2.

The third area A-3 may be adjacent to the first side IC-1 of the driving chip area A-IC between the first areas A-1. An upper side of the third area A-3 may be defined as a portion adjacent to the input pad electrodes IP, and a lower side of the third area A-3 may be defined as a portion adjacent to the driving chip IC. In an embodiment, a length of the upper side of the third area A-3 and a length of the lower side of the third area A-3 may be different from each other. For example, the length of the upper side of the third area A-3 may be greater than the length of the lower side of the third area A-3.

The fourth areas A-4 may be respectively positioned on both sides of the third area A-3 and may be spaced apart from each other in the first direction D1. An upper side of each of the fourth areas A-4 may be defined as a portion adjacent to the input pad electrodes IP, and a lower side of each of the fourth areas A-4 may be defined as a portion adjacent to the output pad electrodes OP. In an embodiment, a length of the upper side of each of the fourth areas A-4 and a length of the lower side of each of the fourth areas A-4 may be different from each other. For example, the length of the upper side of each of the fourth areas A-4 may be greater than the length of the lower side of each of the fourth areas A-4.

Each of the dummy areas A-DU may be adjacent to the first areas A-1. Specifically, the dummy areas A-DU may be positioned between the first areas A-1 and the fourth areas A-4, respectively, and may be spaced apart from each other in the first direction D1. Lines (e.g., the input lines IL, the output lines OL, and gate lines GL) may not be disposed in each of the dummy areas A-DU.

The input pad electrodes IP and the output pad electrodes OP may be disposed on both ends of the base substrate BP. In other words, the input pad electrodes IP may be disposed on one end of the base substrate BP, and the output pad electrodes OP may be disposed on the other end of the base substrate BP.

The input pad electrodes IP may be connected to the external device capable of generating signals. The input pad electrodes IP may include, e.g., a metal, an alloy, a metal nitride, a conductive metal oxide, a transparent conductive material, etc. These may be used alone or in combination with each other. In an embodiment, the input pad electrodes IP may include multiple layers.

The output pad electrodes OP may be connected to the display panel capable of displaying an image. The output pad electrodes OP may include a metal, an alloy, a metal nitride, a conductive metal oxide, a transparent conductive material, etc. These may be used alone or in combination with each other. In an embodiment, the output pad electrodes OP may include layers.

Referring further to FIG. 5, the input lines IL may be disposed on the base substrate BP in the third area A-3. Specifically, the input lines IL may be disposed on the first surface of the base substrate BP in the third area A-3. For example, first ends of the input lines IL may contact the input pad electrodes IP, and second ends, opposite to the first ends, of the input lines IL may be connected to the driving chip IC at the first side IC-1 of the driving chip area A-IC. Some of the input lines IL may extend along an edge of the third area A-3.

In an embodiment, a pitch between the input lines IL at a portion adjacent to the driving chip IC may be smaller than a pitch between the input lines IL at a portion adjacent to the input pad electrodes IP.

The electrode bump EB may be disposed between the driving chip IC and the input lines IL. In this case, the input lines IL and the driving chip IC may be electrically connected through the electrode bump EB. The electrode bump EB may include, e.g., a metal, an alloy, a metal nitride, a conductive metal oxide, a transparent conductive material, etc. These may be used alone in combination with each other.

Accordingly, the input lines IL may electrically connect the driving chip IC and the external device. The input lines IL may transfer power voltage of the driving chip IC and data signals. The input lines IL may include, e.g., a metal, an alloy, a metal nitride, a conductive metal oxide, a transparent conductive material, etc. These may be used alone or in combination with each other.

The output lines OL may be disposed on the base substrate BP in the first areas A-1 and the second area A-2. Specifically, the output lines OL may be disposed on the first surface of the base substrate BP in the first areas A-1 and the second area A-2. For example, first ends of the output lines OL may be connected to the driving chip IC at the first side IC-1, the second side IC-2, the third side IC-3, and the fourth side IC-4 of the driving chip area A-IC, respectively. Second ends, opposite the first ends, of the output lines OL may contact the output pad electrodes OP.

Some of the output lines OL may extend along edges of the first areas A-1 and second area A-2. Specifically, each of the first areas A-1 may include the first bent portions, and some of the output lines OL may extend along the shape of the first bent portions.

A pitch between the output lines OL disposed in each of the first areas A-1 may be smaller than a pitch between the output lines OL disposed in the second area A-2.

In an embodiment, the output lines OL and the dummy areas A-DU may be spaced apart from each other in a plan view. In other words, the output lines OL may not be disposed in the dummy areas A-DU on the base substrate BP.

The electrode bump EB may be disposed between the driving chip IC and the output lines OL. In this case, the output lines OL and the driving chip IC may be electrically connected through the electrode bump EB. Accordingly, the output lines OL may electrically connect the driving chip IC and the display panel. For example, the output lines OL may receive the data signals from the driving chip IC and transfer the data signals to the display panel. The output lines OL may include, e.g., a metal, an alloy, a metal nitride, a conductive metal oxide, a transparent conductive material, etc. These may be used alone or in combination with each other.

Gate lines GL may be disposed on the base substrate BP in each of the fourth areas A-4. Specifically, the gate lines GL may be disposed on the first surface of the base substrate BP in each of the fourth areas A-4. The gate lines GL may be spaced apart from the driving chip IC. In other words, the gate lines GL may bypass the driving chip IC without being connected to the driving chip IC. The gate lines GL may bypass the output lines OL.

For example, first ends of the gate lines GL may contact the input pad electrodes IP. Second ends, opposite to the first ends, of the gate lines GL may contact the output pad electrodes OP. Some of the gate lines GL may extend along edges of the fourth areas A-4.

In an embodiment, a pitch between the gate lines GL at a portion adjacent to the output pad electrodes OP may be smaller than a pitch between the gate lines GL at a portion adjacent to the input pad electrodes IP.

The gate lines GL may electrically connect the external device and the display panel. For example, the gate lines GL may transmit scan signals. The gate lines GL may include a metal, an alloy, a metal nitride, a conductive metal oxide, a transparent conductive material, etc. These may be used alone or in combination with each other.

The adhesive member AM may be disposed on the base substrate BP. Specifically, in an embodiment, the adhesive member AM may be disposed on a second surface, opposite to the first surface, of the base substrate BP. In other words, the adhesive member AM may be disposed on the second surface opposite to the first surface on which each of lines (e.g., the input lines IL, the output lines OL, and the gate lines GL) and the driving chip IC is disposed.

The adhesive member AM may overlap an entirety of the first areas A-1 in a plan view. For example, the adhesive member AM may overlap an entirety of the first bent portions included in each of the first areas A-1 in a plan view. Accordingly, the adhesive member AM may at least partially overlap the output lines OL disposed on the base substrate BP adjacent to the first bent portions in a plan view.

The adhesive member AM may overlap an entirety of the driving chip area A-IC in a plan view. Accordingly, the adhesive member AM may overlap an entirety of the driving chip IC in a plan view.

The adhesive member AM may overlap a part of the second area A-2 in a plan view. Accordingly, the adhesive member AM may at least partially overlap the output lines OL disposed in the second area A-2 of the base substrate BP in a plan view.

The adhesive member AM may be (or may include) a transparent adhesive material such as a pressure sensitive adhesive film (PSA film), an optically clear adhesive film (OCA film), or an optically clear resin (OCR). The adhesive member AM may include a conventional adhesive sheet.

In an embodiment, the adhesive member AM may include a metal. For example, the metal may be aluminum (Au), copper (Cu), etc. However, the disclosure is not limited thereto. In another embodiment, the adhesive member AM may include a flexible film including a flexible material. For example, the adhesive member AM may include a polyimide resin or a polyester resin.

In case that a chip on film package is bent or twisted, stress may be concentrated on the output lines OL disposed on the base substrate BP in the first areas A-1. In case that the stress is high, a line short-circuited may occur in the chip on film package.

To prevent the line short-circuited, the chip on film package according to embodiments of the disclosure may include the adhesive member AM disposed on the base substrate BP and overlapping the entirety of the first areas A-1 in a plan view. Accordingly, stress applied to the output lines OL disposed on the base substrate BP in the first areas A-1 may be dispersed. As a result, the line short-circuited of the chip on film package COF1-1 may not occur.

The chip on film package according to embodiments of the disclosure may include the dummy areas A-DU adjacent to the first areas A-1 and spaced apart from each other in the first direction D1. Accordingly, some of the stress may be dispersed to the dummy areas A-DU where no lines are disposed. As a result, a problem in which other lines (e.g., the gate lines GL) are damaged by the dispersed stress may be improved.

As the stress is dispersed, stress applied to the output lines OL disposed on the base substrate BP in the first areas A-1 may decrease. Therefore, a pitch between the output lines OL disposed in each of the first areas A-1 may be designed to be reduced, and a width of each of the output lines OL disposed in each of the first areas A-1 may be designed to be reduced.

Figure 6:
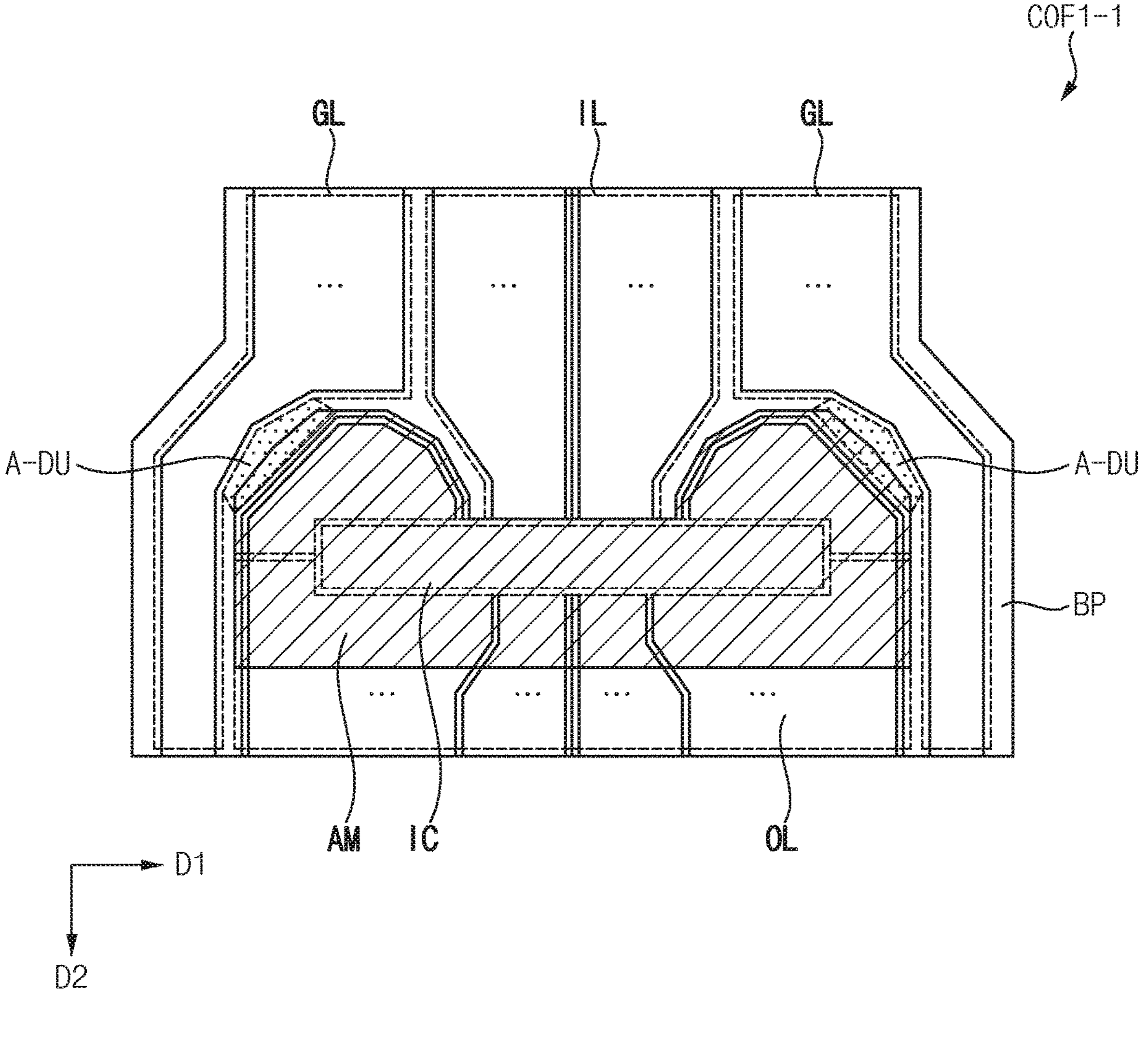

FIG. 6 is a schematic plan view illustrating the chip on film package of FIG. 1.

Referring to FIGS. 3, 4, and 6, the adhesive member AM may be disposed on the second surface of the base substrate BP. For example, the adhesive member AM may be disposed on the second surface opposite to the first surface on which the lines and the driving chip IC are disposed.

The adhesive member AM may overlap the entirety of the first areas A-1 in a plan view. In other words, the adhesive member AM may overlap the entirety of the first bent portions included in each of the first areas A-1 in a plan view. Accordingly, the adhesive member AM may at least partially overlap the output lines OL disposed on the base substrate BP adjacent to the first bent portions in a plan view.

In an embodiment, the adhesive member AM may include second bent portions overlapping the entirety of the first bent portions in a plan view. Each of the second bent portions of the adhesive member AM may have a diagonal shape extending in different directions. In other words, the adhesive member AM may include the second bent portions to correspond to the first bent portions included in each of the first areas A-1.

The adhesive member AM may overlap the entirety of the driving chip area A-IC in a plan view. Accordingly, the adhesive member AM may overlap the entirety of the driving chip IC in a plan view. The adhesive member AM may overlap the portion of the second area A-2 in a plan view. Accordingly, the adhesive member AM may at least partially overlap the output lines OL disposed on the base substrate BP in the second area A-2 in a plan view.

In an embodiment, the adhesive member AM may have an asymmetrical shape with respect to the first side IC-1 of the driving chip area A-IC.

Figure 7:
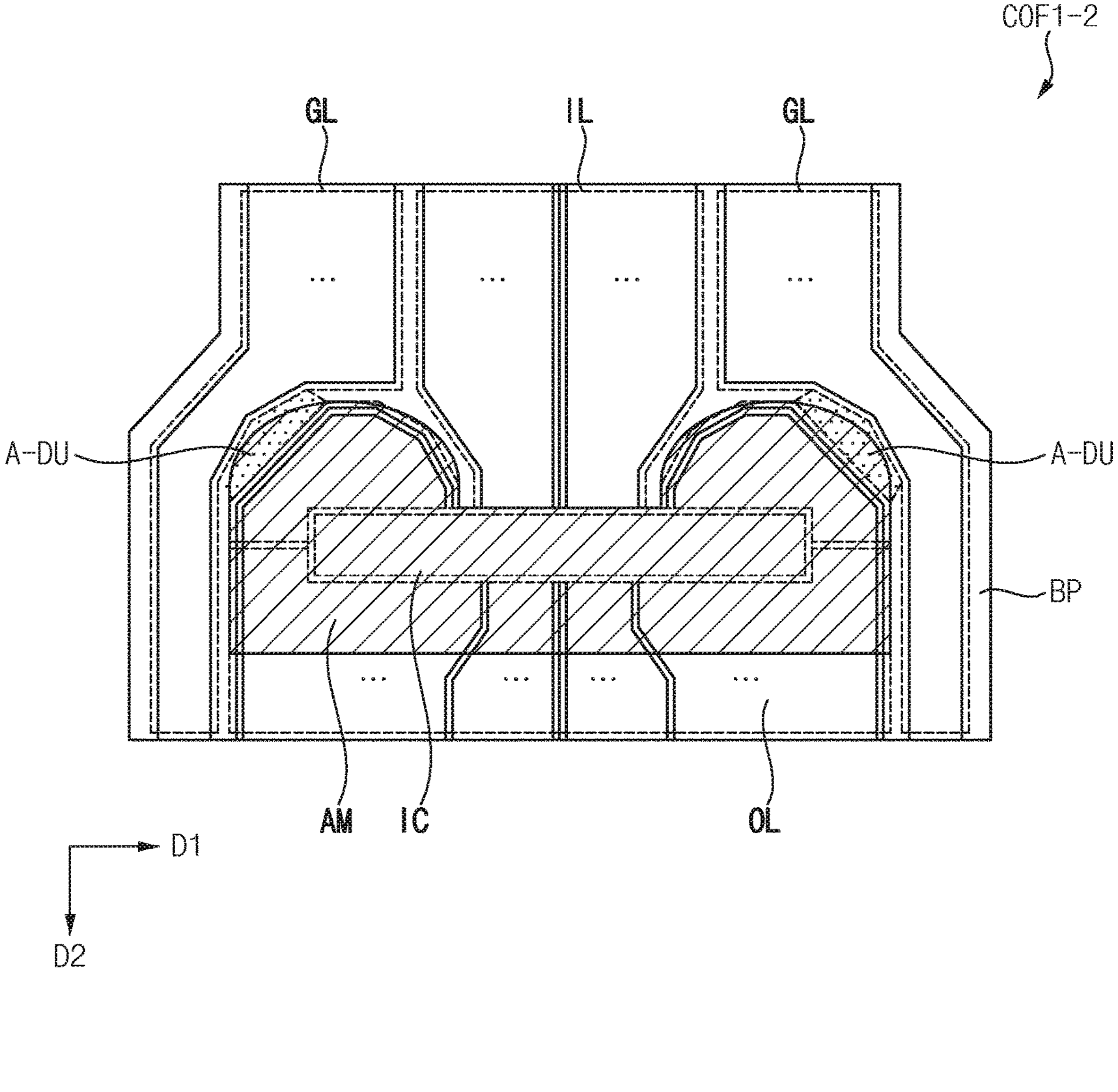
FIG. 7 is a schematic plan view illustrating a chip on film package according to another embodiment of the disclosure.

FIG. 7 is a schematic plan view illustrating a chip on film package according to another embodiment of the disclosure.

Referring to FIGS. 3 and 7, the adhesive member AM included in a chip on film package COF1-2 according to another embodiment of the disclosure may be disposed on the second surface of the base substrate BP. For example, the adhesive member AM may be disposed on the second surface opposite to the first surface on which the lines and the driving chip IC are disposed.

The chip on film package COF1-2 may be distinguishable from the chip on film package COF1-1 described with reference to FIG. 6 at least in the shape of the adhesive member AM. Hereinafter, repetitive descriptions with respect to the chip on film package COF1-1 described with reference to FIG. 6 will be omitted or simplified.

The adhesive member AM may overlap the entirety of the first areas A-1 in a plan view. Specifically, in an embodiment, the adhesive member AM may include curved portions overlapping the entirety of the first bent portions in a plan view. For example, the curved portions may have a shape of a part of a circular curve, a shape of a part of an elliptical curve, etc.

Figure 8:
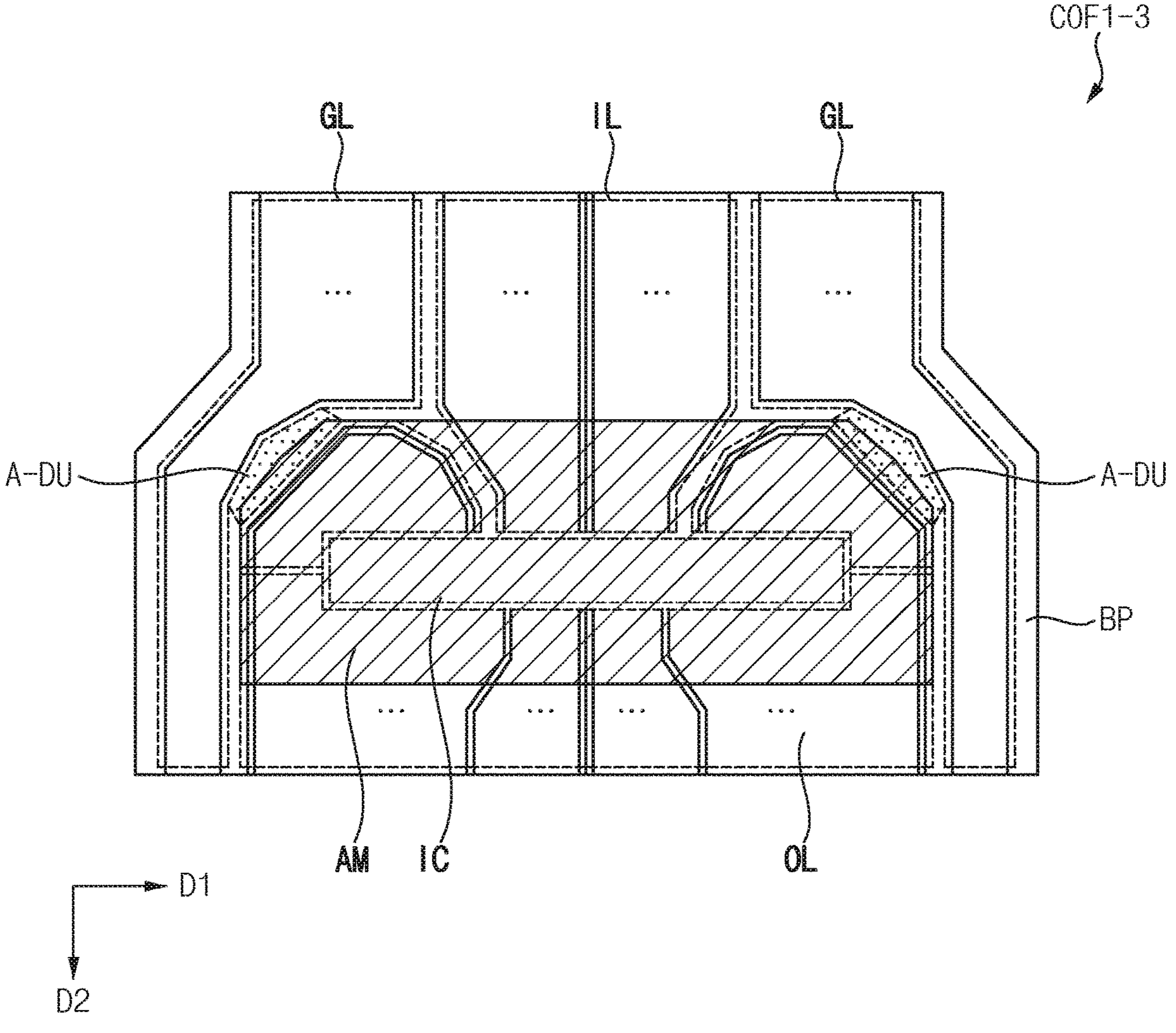
FIG. 8 is a schematic plan view illustrating a chip on film package according to still another embodiment of the disclosure.

FIG. 8 is a schematic plan view illustrating a chip on film package according to still another embodiment of the disclosure.

Referring to FIGS. 3 and 8, the adhesive member AM included in a chip on film package COF1-3 according to still another embodiment of the disclosure may be disposed on the second surface of the base substrate BP. For example, the adhesive member AM may be disposed on the second surface opposite to the first surface on which the lines and the driving chip IC are disposed.

The chip on film package COF1-3 may be distinguishable from the chip on film package COF1-1 described with reference to FIG. 6, at least in the shape of the adhesive member AM. Hereinafter, repetitive descriptions with respect to the chip on film package COF1-1 described with reference to FIG. 6 will be omitted or simplified.

The adhesive member AM may overlap the entirety of the first areas A-1 in a plan view. In other words, the adhesive member AM may overlap the entirety of the first bent portions in a plan view. In an embodiment, the adhesive member AM may overlap a portion of the third area A-3 in a plan view. Accordingly, the adhesive member AM may at least partially overlap the input lines IL disposed on the base substrate BP in the third area A-3 in a plan view.

Figure 9:
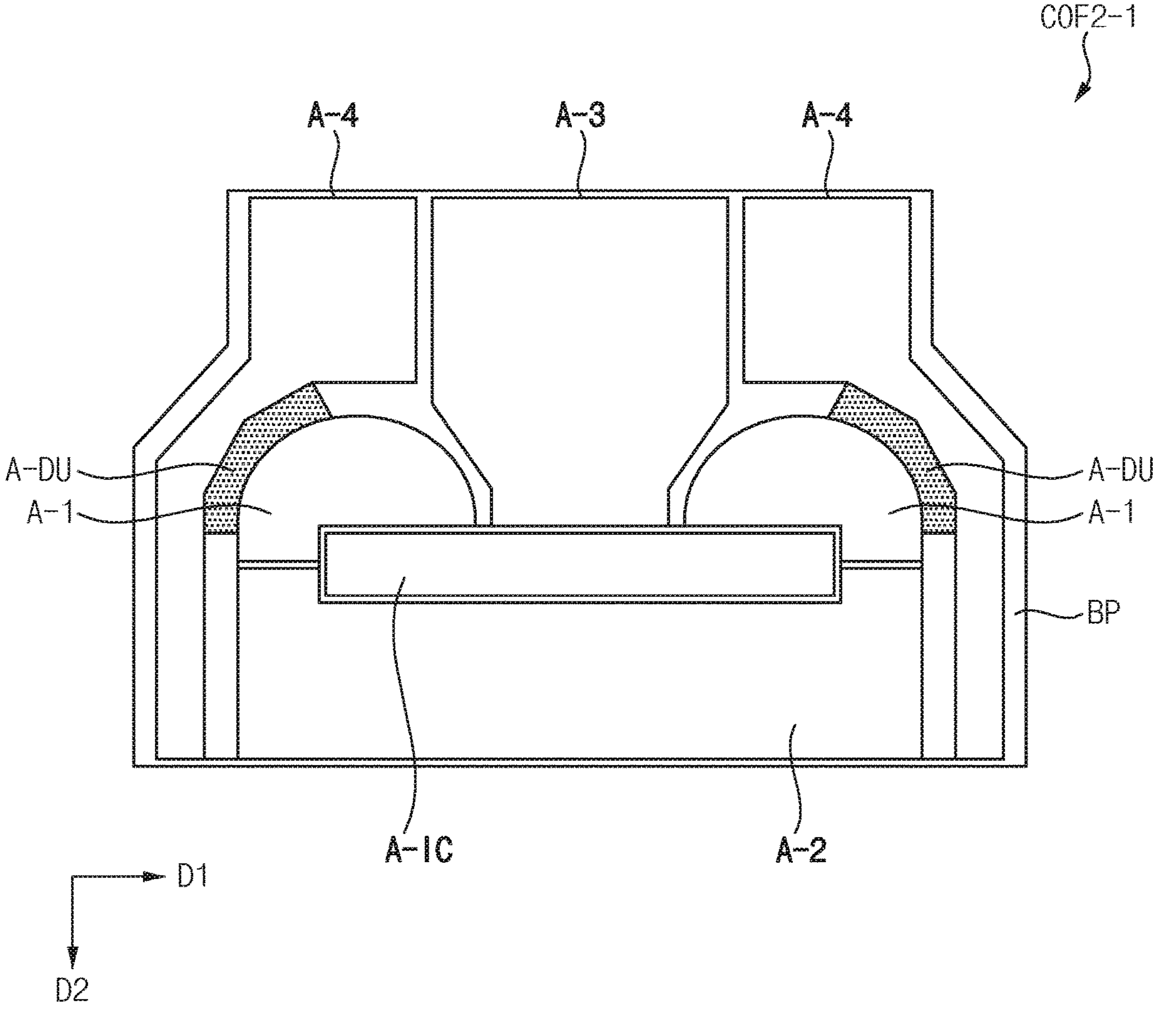
FIGS. 9, 10, and 11 are schematic plan views illustrating a chip on film package according to still another embodiment of the disclosure.
Figure 10:
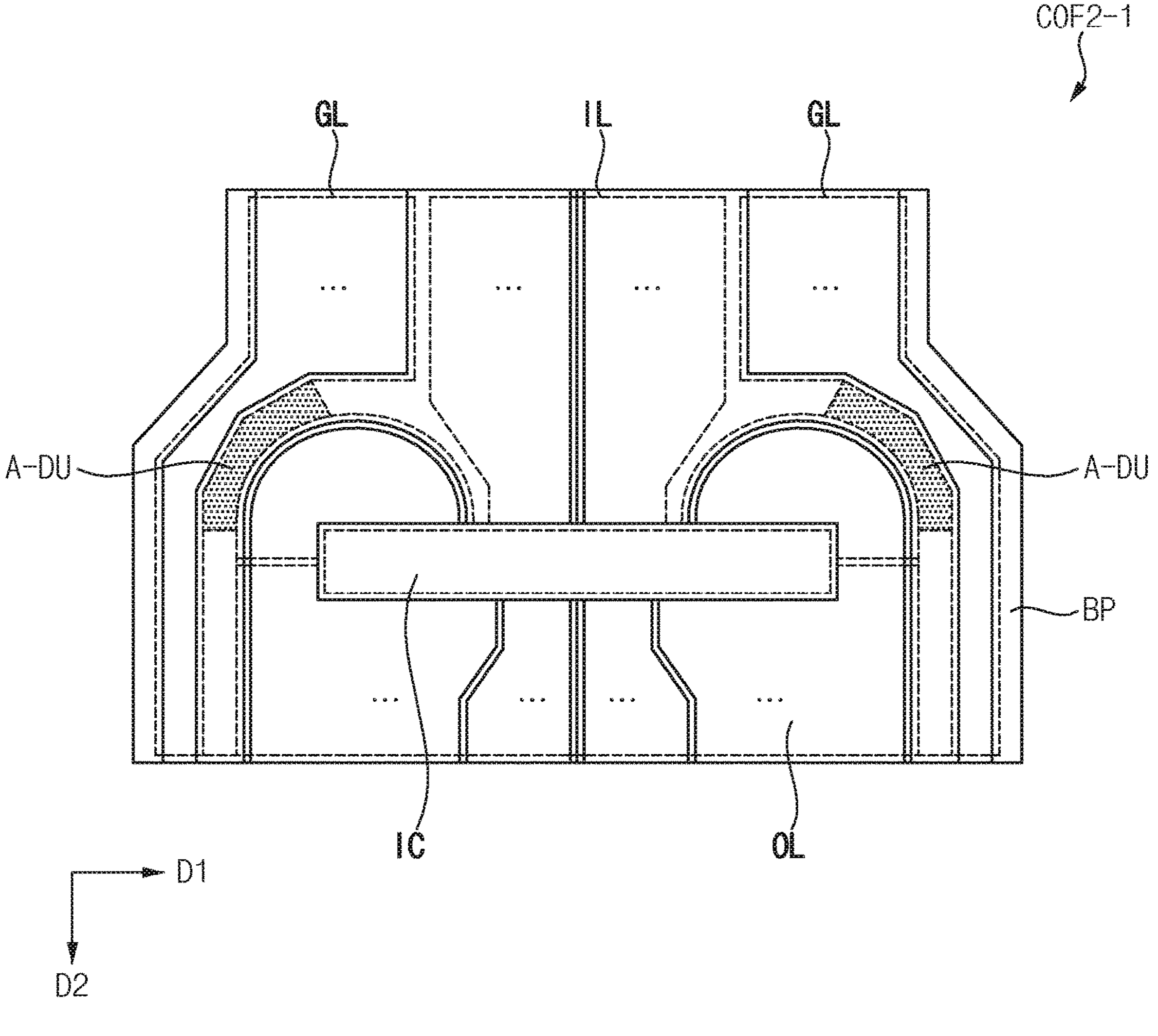
Figure 11:
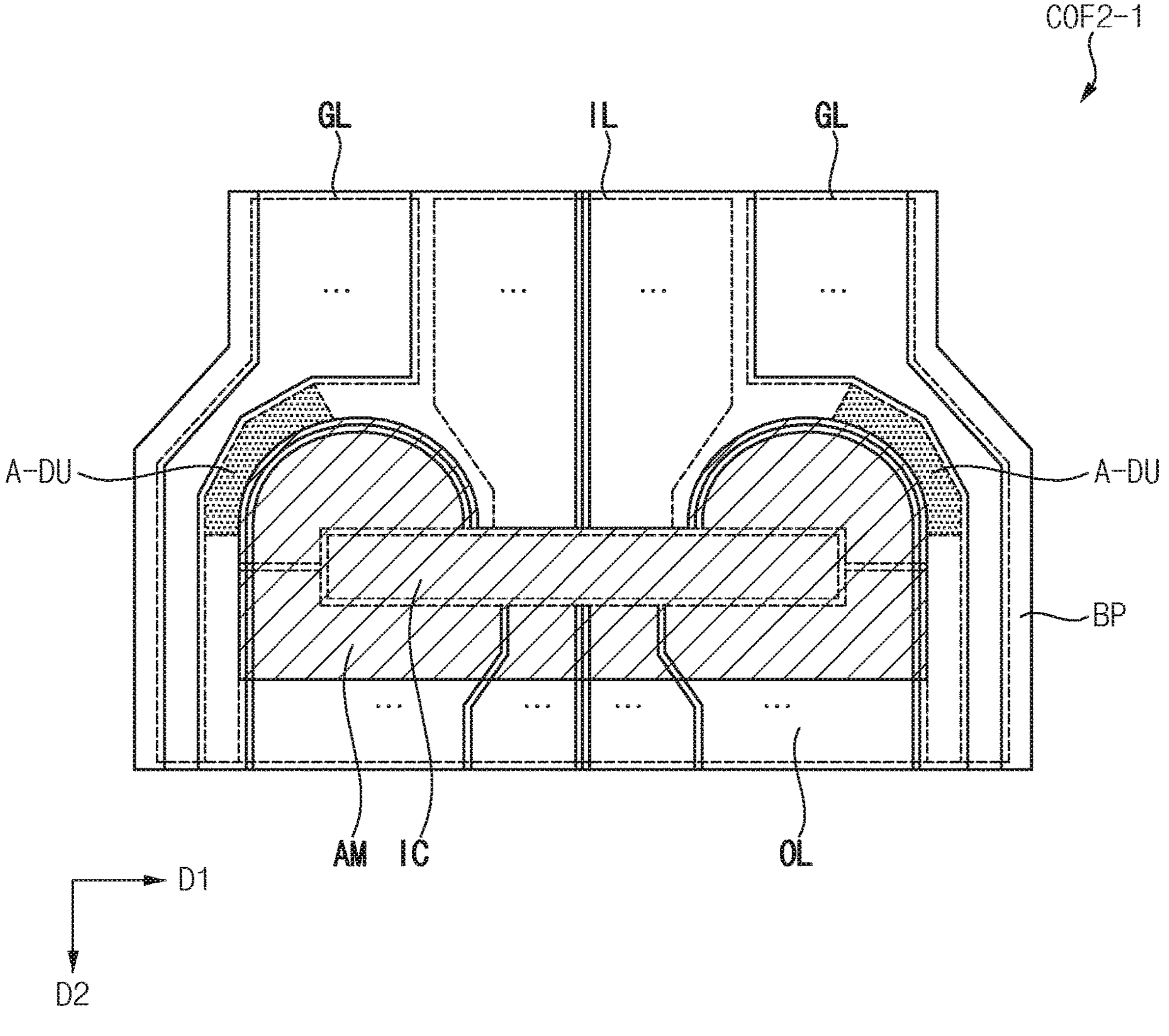

FIGS. 9, 10, and 11 are schematic plan views illustrating a chip on film package according to still another embodiment of the disclosure. For example, FIG. 9 is a plan view illustrating areas of the base substrate BP included in a chip on film package COF2-1.

Referring to FIGS. 9, 10, and 11, the base substrate BP included in the chip on film package COF2-1 according to still another embodiment of the disclosure may include first areas A-1, the second area A-2, the third area A-3, the fourth areas A-4, the dummy areas A-DU, and/or the driving chip area A-IC.

The chip on film package COF2-1 may be distinguishable from the chip on film package COF1-1 described with reference to FIG. 6, at least in the shape of the first areas A-1 and the shape of the adhesive member AM. Hereinafter, descriptions overlapping descriptions of the chip on film package COF1-1 described with reference to FIGS. 3, 4, 5, and 6 will be omitted or simplified.

The first areas A-1 may cover both ends of the first side (e.g., the first side IC-1 of FIG. 4) of the driving chip area A-IC and may be spaced apart from each other in the first direction D1. Each of the first areas A-1 may include a first curved portion. For example, the first curved portion may have a shape of a part of a circular curve, a shape of a part of an elliptical curve, etc.

The output lines OL may be disposed on the base substrate BP in the first areas A-1 and the second area A-2. Specifically, the output lines OL may be disposed on the first surface of the base substrate BP in the first areas A-1 and the second area A-2. The output lines OL may not be disposed in the dummy areas A-DU of the base substrate BP.

The adhesive member AM may be disposed on the second surface of the base substrate BP opposite to the first surface. The adhesive member AM may overlap the entirety of the first areas A-1 in a plan view. Specifically, the adhesive member AM may include a second curved portion overlapping the entirety of the first curved portion in a plan view. For example, the second curved portion may have a shape of a part of a circular curve, a shape of a part of an elliptical curve, etc. In other words, the adhesive member AM may include the second curved portion to correspond to the first curved portion included in each of the first areas A-1.

Figure 12:
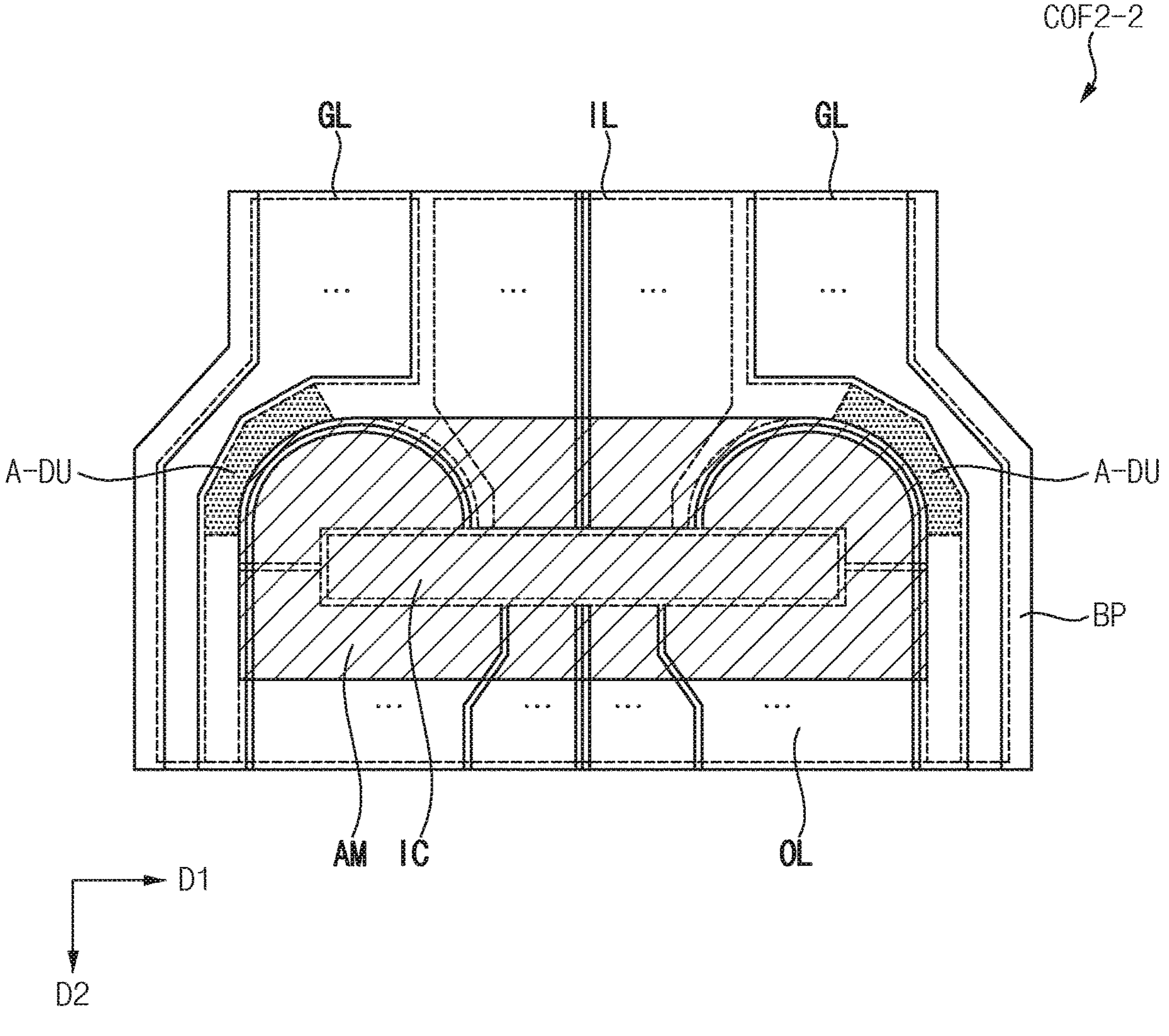
FIG. 12 is a schematic plan view illustrating a chip on film package according to still another embodiment of the disclosure.

FIG. 12 is a schematic plan view illustrating a chip on film package according to still another embodiment of the disclosure.

Referring to FIGS. 9 and 12, the adhesive member AM included in a chip on film package COF2-2 according to still another embodiment of the disclosure may be disposed on the second surface of the base substrate BP. For example, the adhesive member AM may be disposed on the second surface opposite to the first surface on which the lines and the driving chip IC are disposed.

The chip on film package COF2-2 may be distinguishable from the chip on film package COF2-1 described with reference to FIG. 11, at least in the shape of the adhesive member AM. Hereinafter, descriptions overlapping descriptions of the chip on film package COF2-1 described with reference to FIG. 11 will be omitted or simplified.

The adhesive member AM may overlap the entirety of the first areas A-1 in a plan view. In other words, the adhesive member AM may overlap the entirety of the first curved portion in a plan view. In an embodiment, the adhesive member AM may overlap a part of the third area A-3 in a plan view. Accordingly, the adhesive member AM may at least partially overlap the input lines IL disposed on the base substrate BP in the third area A-3 in a plan view.

Figure 13:
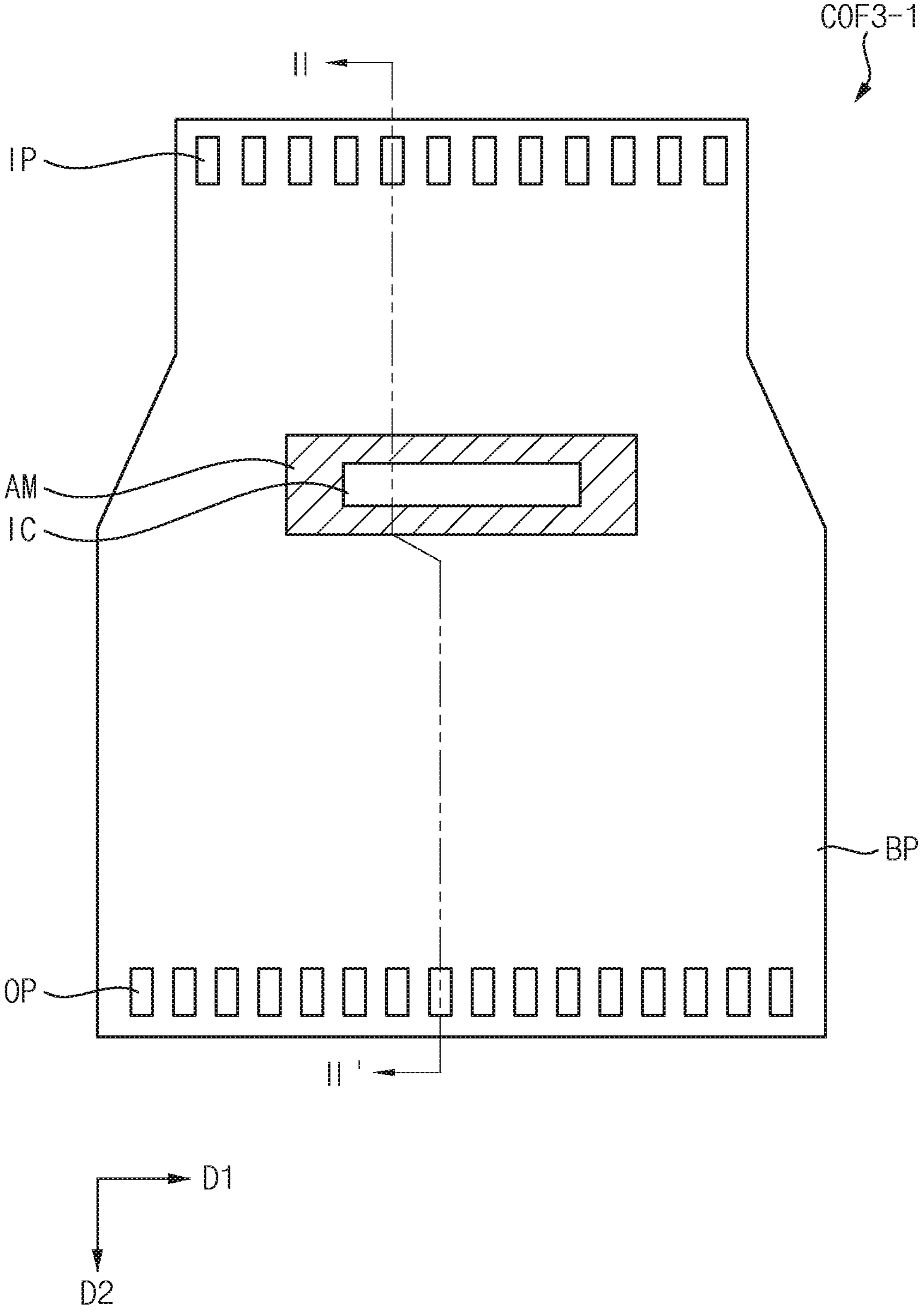
FIG. 13 is a schematic plan view illustrating a chip on film package according to still another embodiment of the disclosure.
Figure 14:
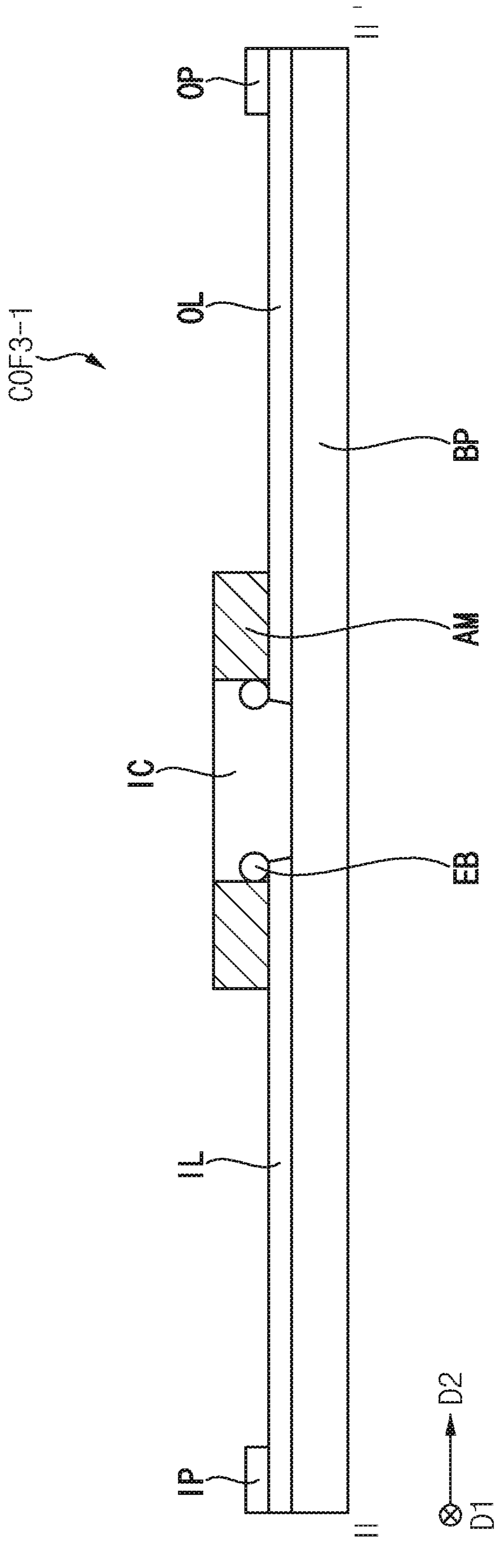
FIG. 14 is a schematic cross-sectional view taken along line II-II' of FIG. 13.
Figure 15:
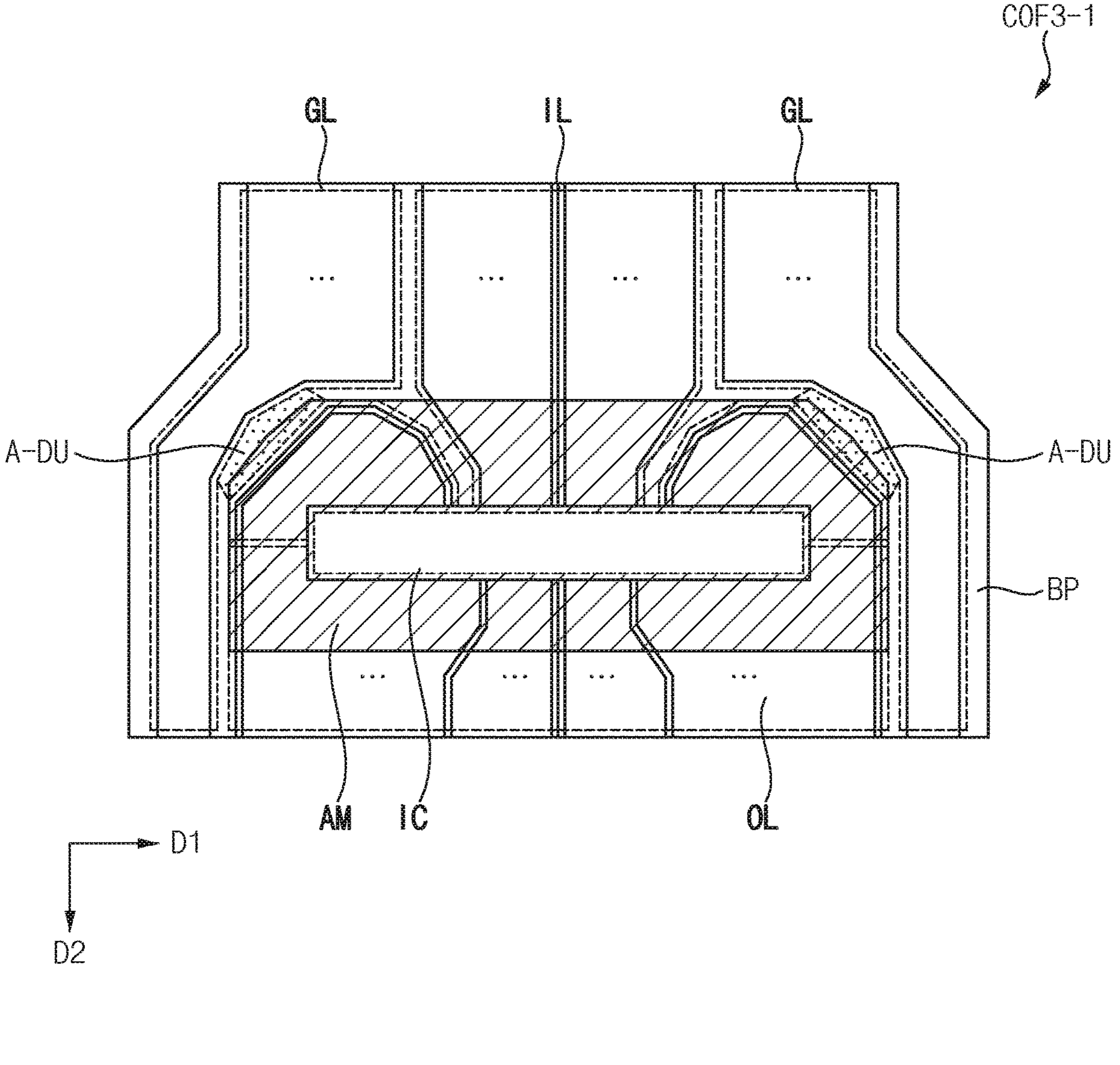
FIG. 15 is a schematic plan view illustrating the chip on film package of FIG. 13.

FIG. 13 is a schematic plan view illustrating a chip on film package according to still another embodiment of the disclosure. FIG. 14 is a schematic cross-sectional view taken along line II-II' of FIG. 13. FIG. 15 is a schematic plan view illustrating the chip on film package of FIG. 13.

Referring to FIGS. 3, 13, 14, and 15, a chip on film package COF3-1 according to still another embodiment of the disclosure may include the base substrate BP, the driving chip IC, the input pad electrodes IP, the output pad electrodes OP, the input lines IL, the output lines OL, the electrode bump EB, and/or the adhesive member AM.

The chip on film package COF3-1 may be distinguishable from the chip on film package COF1-1 described with reference to FIGS. 1, 2, 3, 4, 5, and 6, at least in the shape of the adhesive member AM and a surface on which the adhesive member AM is attached to the base substrate BP. Hereinafter, repetitive descriptions with respect to the chip on film package COF1-1 described with reference to FIGS. 1, 2, 3, 4, 5, and 6 will be omitted or simplified.

The base substrate BP may include the first areas A-1, the second area A-2, the third area A-3, the fourth areas A-4, the dummy areas A-DU, and/or the driving chip area A-IC. The first areas A-1 may cover both ends of the first side of the driving chip area A-IC and may be spaced apart from each other in the first direction D1. Each of the first areas A-1 may include first bent portions. Each of the first bent portions may have a diagonal shape extending in different directions.

Each of the lines (e.g., the input lines IL, the output lines OL, etc.) and the driving chip IC may be disposed on the first surface of the base substrate BP. In an embodiment, the adhesive member AM may be disposed on the first surface of the base substrate BP. That is, the adhesive member AM may be disposed on the same surface as the surface on which the lines and the driving chip IC are disposed.

The adhesive member AM may overlap the entirety of the first areas A-1 in a plan view. In other words, the adhesive member AM may overlap the entirety of the first bent portions in a plan view. In an embodiment, the adhesive member AM may define an opening exposing the driving chip IC in the driving chip area A-IC.

Figure 16:
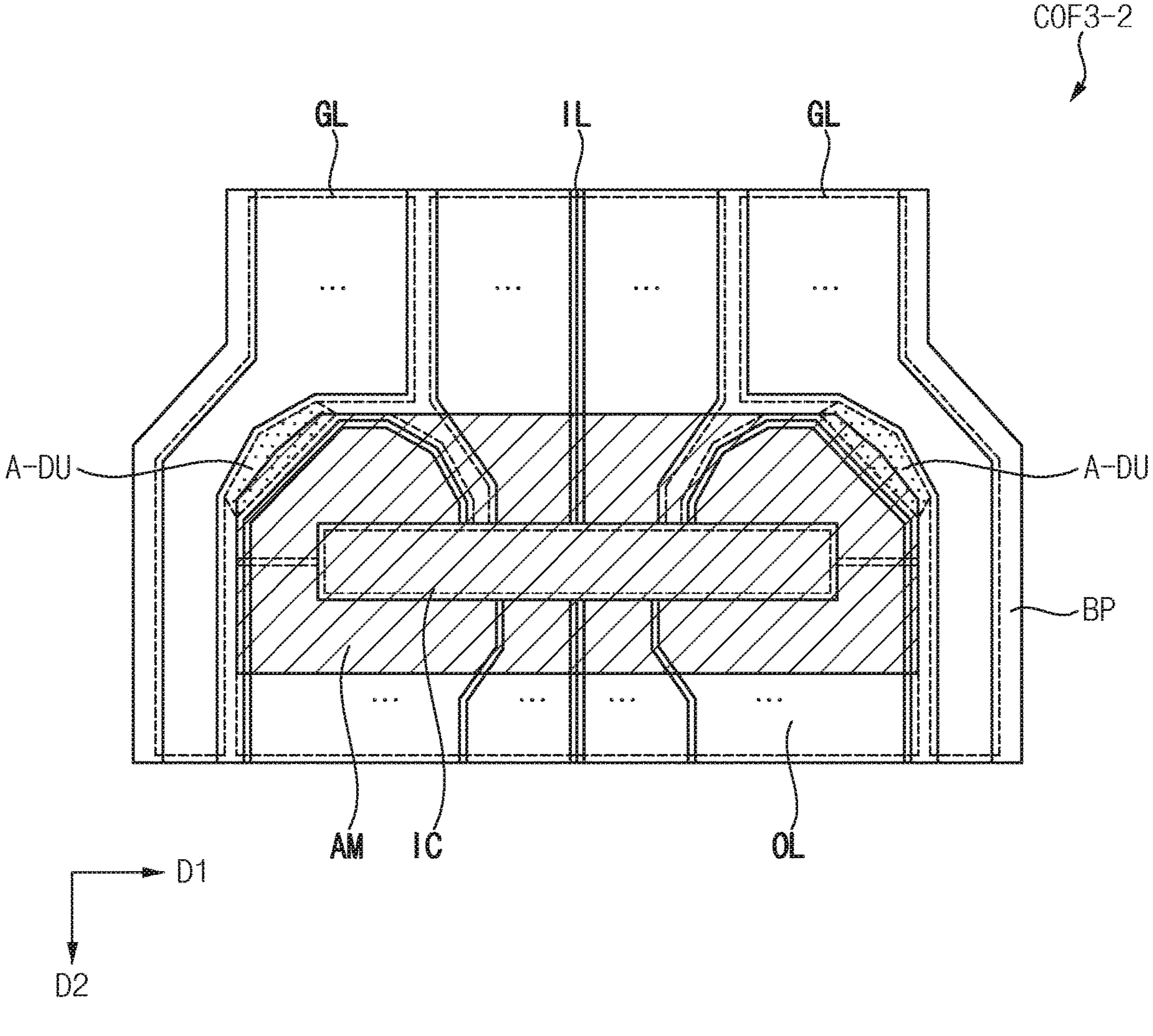
FIG. 16 is a schematic plan view illustrating a chip on film package according to still another embodiment of the disclosure.

FIG. 16 is a schematic plan view illustrating a chip on film package according to still another embodiment of the disclosure.

Referring to FIGS. 3 and 16, the adhesive member AM included in a chip on film package COF3-2 according to still another embodiment of the disclosure may be disposed on the first surface of the base substrate BP. For example, the adhesive member AM may be disposed on the same surface as the surface on which the lines and the driving chip IC are disposed.

The chip on film package COF3-2 may be distinguishable from the chip on film package COF3-1 described with reference to FIG. 15, at least in the shape of the adhesive member AM. Hereinafter, repetitive descriptions with respect to the chip on film package COF3-1 described with reference to FIG. 15 will be omitted or simplified.

The adhesive member AM may overlap the entirety of the first areas A-1 in a plan view. In other words, the adhesive member AM may overlap the entirety of the first bent portions in a plan view. In an embodiment, the adhesive member AM may overlap the entirety of the driving chip area A-IC in a plan view. In other words, even in case that the adhesive member AM is disposed on the same surface as the surface on which the driver chip IC is disposed, the adhesive member AM may overlap the entirety of the driving chip area A-IC in a plan view. Accordingly, the adhesive member AM may overlap the entirety of the driving chip IC in a plan view.

Figure 17:
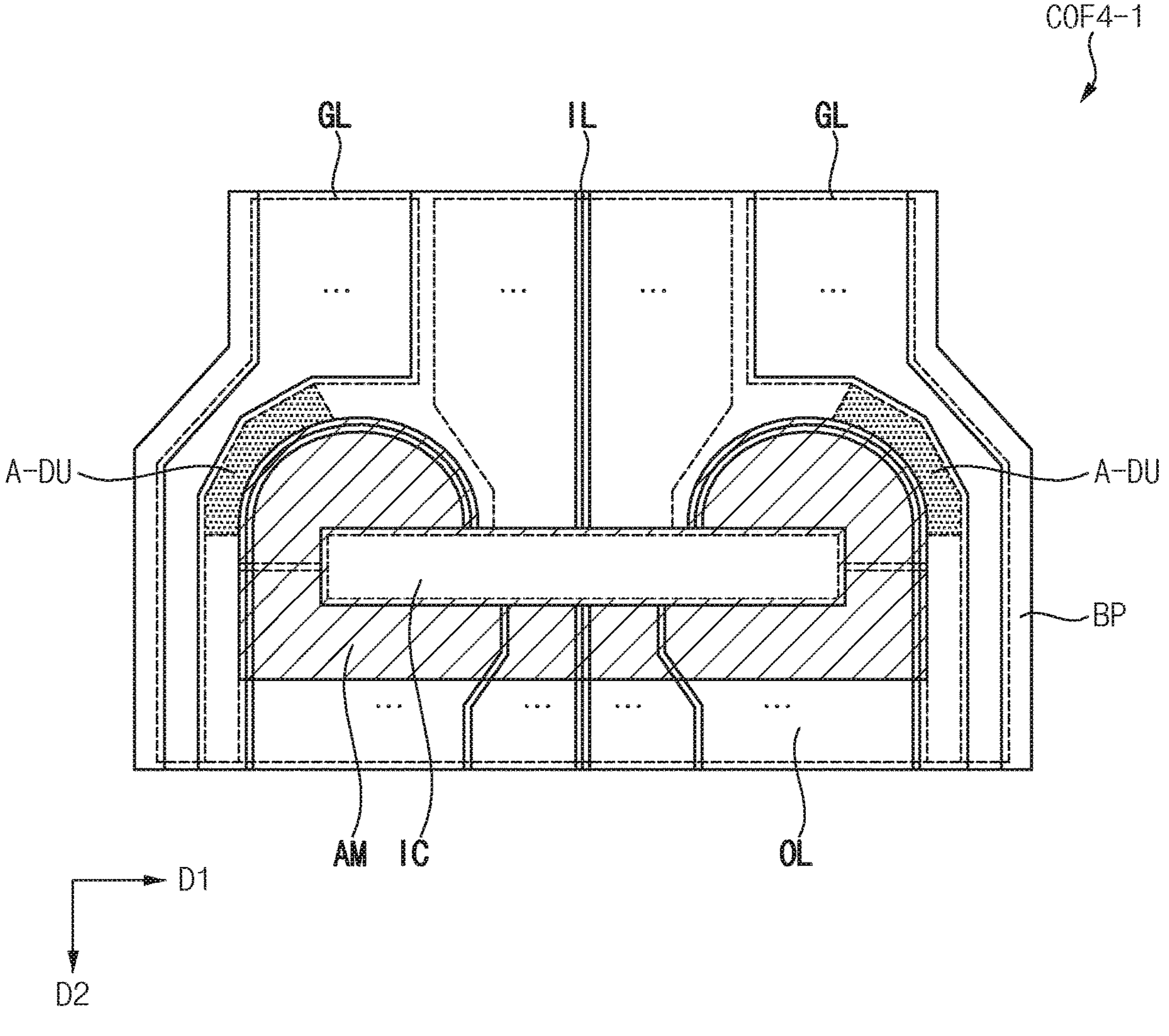
FIG. 17 is a schematic plan view illustrating a chip on film package according to still another embodiment of the disclosure.

FIG. 17 is a schematic plan view illustrating a chip on film package according to still another embodiment of the disclosure.

Referring to FIGS. 9 and 17, the base substrate BP included in a chip on film package COF4-1 according to still another embodiment of the disclosure may include first areas A-1, the second area A-2, the third area A-3, the fourth areas A-4, the dummy areas A-DU, and/or the driving chip area A-IC.

The chip on film package COF4-1 may be distinguishable from the chip on film package COF3-1 described with reference to FIG. 15, at least in the shape of the first areas A-1 and the shape of the adhesive member AM. Hereinafter, repetitive descriptions with respect to the chip on film package COF3-1 described with reference to FIG. 15 will be omitted or simplified.

The first areas A-1 may cover both ends of the first side of the driving chip area A-IC and may be spaced apart from each other in the first direction D1. Each of the first areas A-1 may include a first curved portion. For example, the first curved portion may have a shape of a part of a circular curve, a shape of a part of an elliptical curve, etc.

The adhesive member AM may be disposed on the first surface of the base substrate BP. For example, the adhesive member AM may be disposed on the same surface as the surface on which the lines and the driving chip IC are disposed.

The adhesive member AM may overlap the entirety of the first areas A-1 in a plan view. Specifically, the adhesive member AM may include a second curved portion overlapping the entirety of the first curved portion in a plan view. For example, the second curved portion may have a shape of a part of a circular curve, a shape of a part of an elliptical curve, etc. In other words, the adhesive member AM may include the second curved portion to correspond to the first curved portion included in each of the first areas A-1. The adhesive member AM may define an opening exposing the driving chip IC in the driving chip area A-IC.

Figure 18:
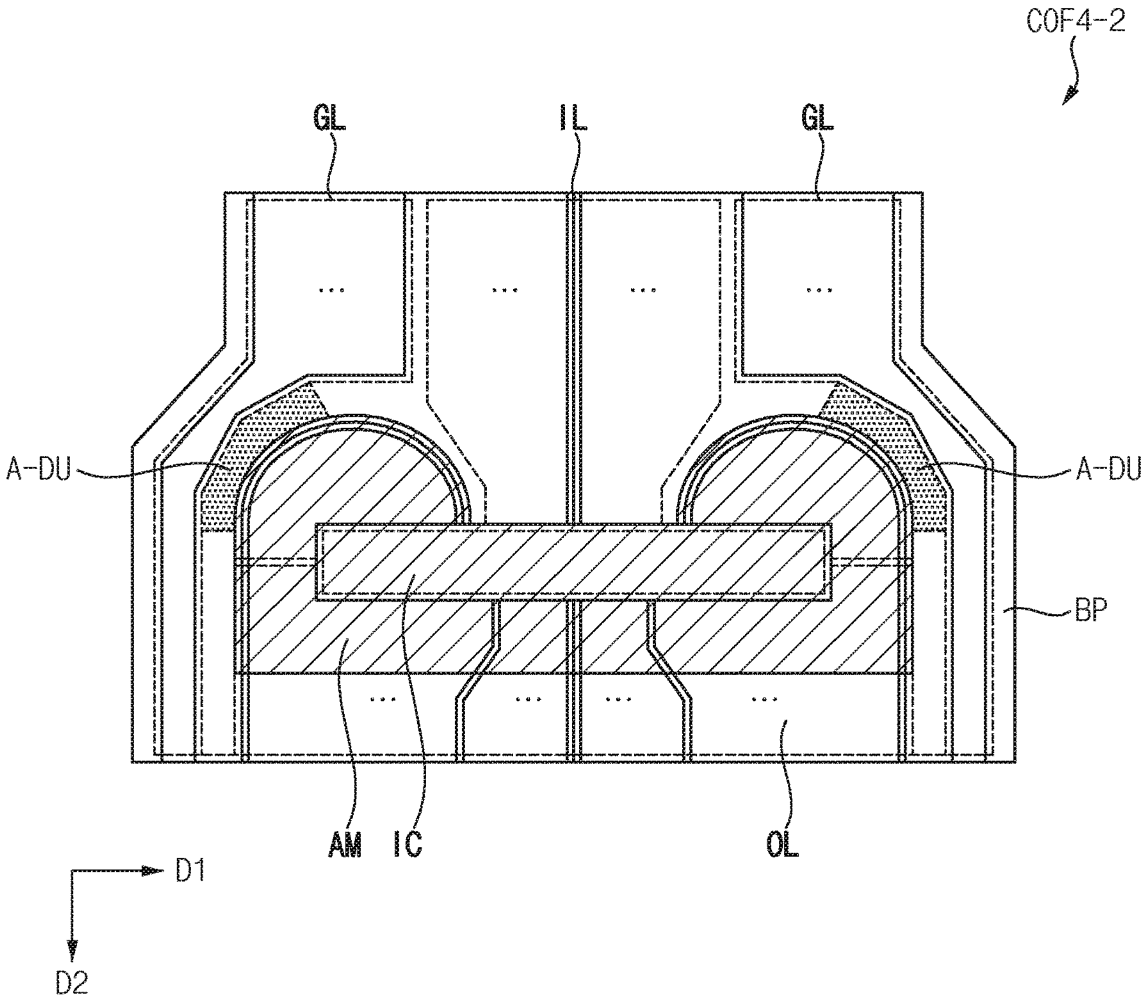
FIG. 18 is a schematic plan view illustrating a chip on film package according to still another embodiment of the disclosure.

FIG. 18 is a schematic plan view illustrating a chip on film package according to still another embodiment of the disclosure.

Referring to FIGS. 9 and 18, the adhesive member AM included in a chip on film package COF4-2 according to still another embodiment of the disclosure may be disposed on the first surface of the base substrate BP. For example, the adhesive member AM may be disposed on the same surface as the surface on which the lines and the driving chip IC are disposed.

The chip on film package COF4-2 may be distinguishable from the chip on film package COF4-1 described with reference to FIG. 17 at least in the shape of the adhesive member AM. Hereinafter, repetitive descriptions with respect to the chip on film package COF4-1 described with reference to FIG. 17 will be omitted or simplified.

The adhesive member AM may overlap the entirety of the first areas A-1 in a plan view. In other words, the adhesive member AM may overlap the entirety of the first curved portion in a plan view. In an embodiment, the adhesive member AM may overlap the entirety of the driving chip area A-IC in a plan view. In other words, even when the adhesive member AM is disposed on the same surface as the surface on which the driver chip IC is disposed, the adhesive member AM may overlap the entirety of the driving chip area A-IC in a plan view. Accordingly, the adhesive member AM may overlap the entirety of the driving chip IC in a plan view.

Figure 19:
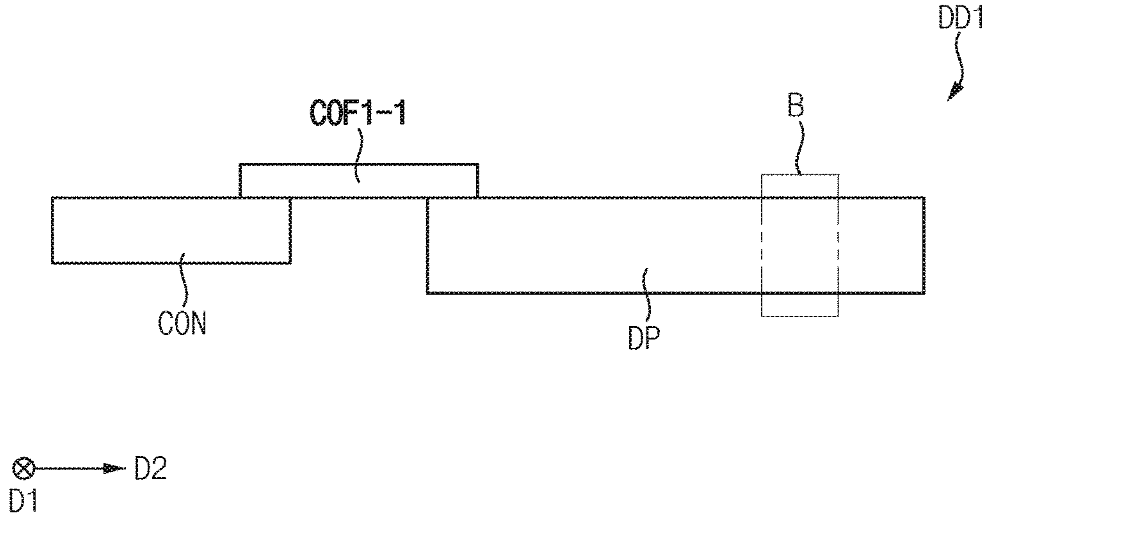
FIG. 19 is a schematic cross-sectional view illustrating a display device according to an embodiment of the disclosure.
Figure 20:
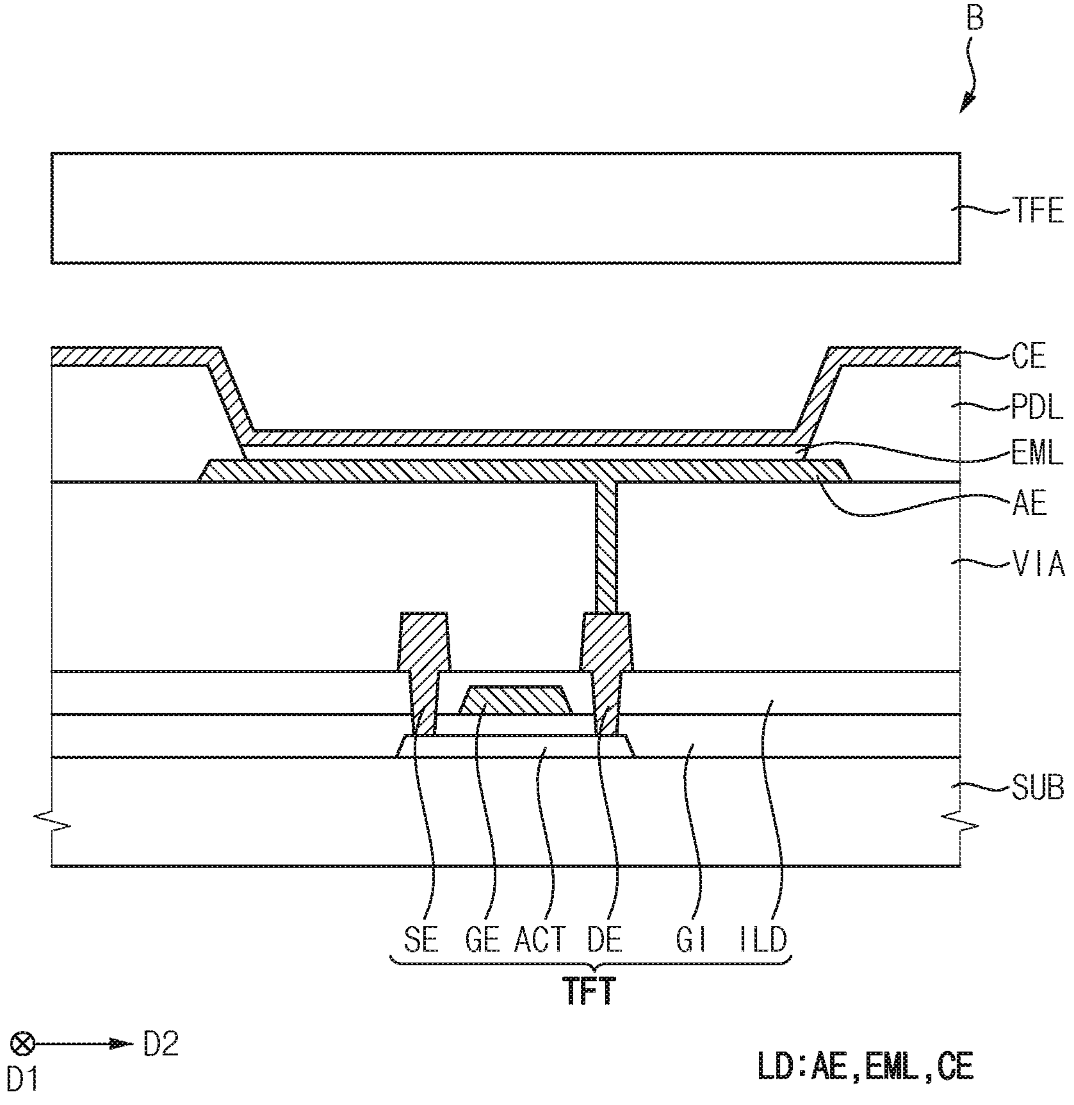
FIG. 20 is a schematic enlarged cross-sectional view of part B of FIG. 19.

FIG. 19 is a schematic cross-sectional view illustrating a display device according to an embodiment of the disclosure. FIG. 20 is a schematic enlarged cross-sectional view of part B of FIG. 19. Hereinafter, a detailed description of the chip on film package COF1-1 will be omitted.

Referring to FIG. 19, a display device DD1 may include a display panel DP, the chip on film package COF1-1, and an external device CON.

The chip on film package COF1-1 may be connected to a side of the display panel DP. The display panel DP may include a display area and a non-display area. The display area may be defined as an area capable of displaying an image by emitting light. The display area may include pixels. Each of the pixels may emit light. The non-display area may be defined as an area that does not emit light and may include a driving circuit for driving the display area.

A side of the chip on film package COF1-1 may be connected to the display panel DP, and another side of the chip on film package COF1-1 may be connected to the external device CON.

The chip on film package COF1-1 may be connected to one side of the external device CON. The external device CON may generate a data signal, a scan signal, a light emitting signal, a power voltage, a touch sensing signal, etc. The external device CON may provide signals such as the data signal, the scan signal, the light emitting signal, the power supply voltage, the touch sensing signal, and the like to the display panel DP through the chip on film package COF1-1.

Referring to FIG. 20, the display panel DP may include a substrate SUB, a thin film transistor TFT, a via insulating layer VIA, a light emitting element LD, and an encapsulation layer TFE. The thin film transistor TFT may include an active layer ACT, a gate insulating layer GI, a gate electrode GE, an inter-layer insulating layer ILD, a source electrode SE, and/or a drain electrode DE. The light emitting element LD may include a lower electrode AE, a light emitting layer EML, and an upper electrode CE.

The substrate SUB may include a transparent material or an opaque material. The substrate SUB may be formed of a transparent resin substrate. Examples of the transparent resin substrate may include a polyimide substrate. In this case, the polyimide substrate may include a first organic layer, a first barrier layer, a second organic layer, etc. As another example, examples of the substrate SUB may include a quartz substrate, a synthetic quartz substrate, a calcium fluoride substrate, a fluorine-doped quartz substrate, a soda-lime glass substrate, a non-alkali glass substrate, etc. These may be used alone or in combination with each other.

A buffer layer may be disposed on the substrate SUB. The buffer layer may prevent diffusion of impurities, such as oxygen and moisture, from the substrate SUB to an upper structure. The buffer layer may include an inorganic insulating material such as a silicon compound or a metal oxide, etc.

The active layer ACT may be disposed on the substrate SUB. The active layer ACT may include an oxide semiconductor, a silicon semiconductor, an organic semiconductor, etc. For example, the oxide semiconductor may include indium (In), gallium (Ga), tin (Sn), zirconium (Zr), vanadium (V), hafnium (Hf), cadmium (Cd), germanium (Ge), chromium (Cr), titanium (Ti), zinc (Zn), etc. These may be used alone or in combination with each other. The silicon semiconductor may include amorphous silicon, polycrystalline silicon, etc. The active layer ACT may include a source area, a drain area, and a channel area positioned between the source area and the drain area.

The gate insulating layer GI may be disposed on the active layer ACT and the substrate SUB. The gate insulating layer GI may cover the active layer ACT. A contact hole may be defined in the gate insulating layer GI. The contact hole may expose a part of the active layer ACT. The gate insulating layer GI may include an insulating material. Examples of the insulating material that may be used as the gate insulating layer GI may include silicon oxide ($SiO_x$), silicon nitride ($SiN_x$), silicon oxynitride ($SiO_xN_y$), etc. These may be used alone or in combination with each other.

The gate electrode GE may be disposed on the gate insulating layer GI. The gate electrode GE may partially overlap the active layer ACT in a plan view. The gate electrode GE may include a metal, an alloy, a metal nitride, a conductive metal oxide, a transparent conductive material, etc. Examples of material that may be used as the gate electrode GE may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. These may be used alone or in combination with each other.

The inter-layer insulating layer ILD may be disposed on the gate electrode. The inter-layer insulating layer ILD may cover the gate electrode GE. A contact hole may be defined in the inter-layer insulating layer ILD. The contact hole may expose a part of the active layer ACT. The inter-layer insulating layer ILD may include an inorganic insulating material. For example, the inter-layer insulating layer ILD may include a silicon compound, a metal oxide, etc.

The source electrode SE and the drain electrode DE may be disposed on the inter-layer insulating layer ILD. Each of the source electrode SE and the drain electrode DE may be electrically connected to the active layer ACT through a contact hole formed in the inter-layer insulating layer ILD and the gate insulating layer GI. Each of the source electrode SE and the drain electrode DE may include a metal, an alloy, a metal nitride, a conductive metal oxide, a transparent conductive material, etc. These may be used alone or in combination with each other. Accordingly, the thin film transistor TFT including the active layer ACT, the gate electrode GE, the source electrode SE, and the drain electrode DE may be formed.

The via insulating layer VIA may be disposed on the source electrode SE and the drain electrode DE. The via insulating layer VIA may cover the source electrode SE and the drain electrode DE. That is, the via insulation layer VIA may be entirely disposed on the inter-layer insulating layer ILD. A contact hole may be defined in the via insulating layer VIA. The contact hole may expose a part of the drain electrode DE. The via insulating layer VIA may include an organic insulating material. The organic insulating material may be photoresist, polyacryl-based resin, polyimide-based resin, siloxane-based resin, acryl-based resin, etc. These may be used alone or in combination with each other.

The lower electrode AE may be disposed on the via insulating layer VIA. The lower electrode AE may be electrically connected to the drain electrode DE through a contact hole formed in the via insulating layer VIA. As a result, the lower electrode AE may be electrically connected to the transistor TFT. The lower electrode AE may include a metal, an alloy, a metal nitride, a conductive metal oxide, a transparent conductive material, etc. These may be used alone or in combination with each other. For example, the lower electrode AE may serve as an anode electrode.

The pixel defining layer PDL may be disposed on the via insulating layer VIA. The pixel defining layer PDL may cover an edge of the lower electrode AE and may expose a part of an upper surface of the lower electrode AE. The pixel defining layer PDL may include an organic insulating material. The organic insulating material may be photoresist, polyacryl-based resin, polyimide-based resin, siloxane-based resin, acryl-based resin, etc. These may be used alone or in combination with each other.

The light emitting layer EML may be disposed on the lower electrode AE, at least partially of which is exposed. The light emitting layer EML may include at least one of an organic light emitting material and a quantum dot. The organic light emitting material may include a low-molecular-weight organic compound or a high-molecular-weight organic compound. Examples of the low-molecular-weight organic compound may include copper phthalocyanine, N,N'-diphenylbenzidine, tri-(8-hydroxyquinoline)aluminum), etc. Examples of the high-molecular-weight organic compound may include poly(3,4-ethylenedioxythiophene), polyaniline, poly-phenylenevinylene, polyfluorene, etc. These may be used alone or in combination with each other. However, the disclosure is not limited thereto.

The upper electrode CE may be disposed on the pixel defining layer PDL and the light emitting layer EML. For example, the upper electrode CE may include a metal, an alloy, a metal nitride, a conductive metal oxide, a transparent conductive material, etc. These may be used alone or in combination with each other. For example, the upper electrode CE may serve as a cathode electrode. Accordingly, the light emitting element LD including the lower electrode AE, the light emitting layer EML, and the upper electrode CE may be formed.

The encapsulation layer TFE may be disposed on the upper electrode CE. The encapsulation layer TFE may prevent impurities, moisture, and the like from permeating the light emitting element LD from the outside. The encapsulation layer TFE may include at least one inorganic encapsulation layer and at least one organic encapsulation layer. For example, the inorganic encapsulation layer may include silicon oxide, silicon nitride, silicon oxynitride, etc., and the organic encapsulation layer may include a polymer cured material such as polyacrylate.

Although the display device DD1 of the disclosure is described by limiting the organic light emitting display device ("OLED"), the configuration of the disclosure is not limited thereto. In other embodiments, the display device DD1 may include a liquid crystal display device ("LCD"), a field emission display device ("FED"), a plasma display device ("PDP"), an electrophoretic image display device ("EPD"), an inorganic light emitting display device ("ILED"), or a quantum dot display device.

Figure 21:
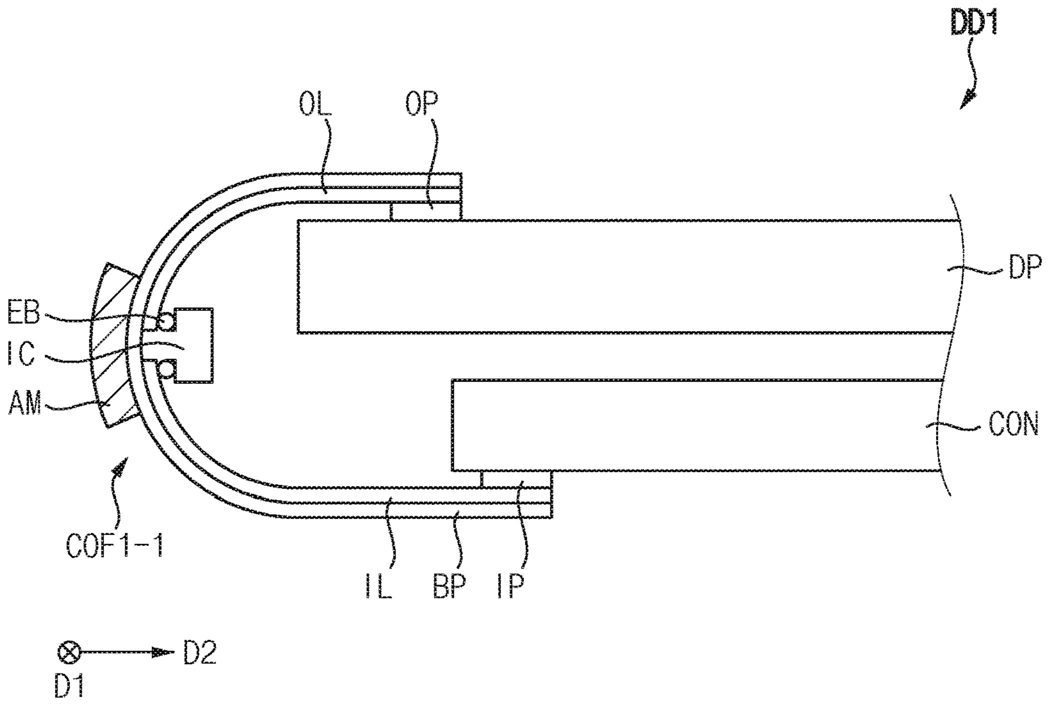
FIG. 21 is a schematic cross-sectional view illustrating a bent shape of a chip on film package included in the display device of FIG. 19.

FIG. 21 is a schematic cross-sectional view illustrating a bent shape of a chip on film package included in the display device of FIG. 19.

Referring to FIG. 21, the display device DD1 may include the display panel DP, the chip on film package COF1-1, and the external device CON. The chip on film package COF1-1 may include the base substrate BP, the driving chip IC, the input pad electrodes IP, the output pad electrodes OP, the input lines IL, the output lines OL, the electrode bump EB, and the adhesive member AM.

The input pad electrodes IP of the chip on film package COF1-1 may be directly connected to pad electrodes of the external device CON through an anisotropic conductive film (ACF). The output pad electrodes OP of the chip on film package COF1-1 may be directly connected to pad electrodes of the display panel DP through the anisotropic conductive film. After the chip on film package COF1-1 is connected to the display panel DP and the external device CON, the chip on film package COF1-1 may be bent. In case that the chip on film package COF1-1 is bent, the external device CON may be positioned on a lower surface of the display panel DP.

In case that the chip on film package COF1-1 included in the display device DD1 is bent to position the external device CON on the lower surface of the display panel DP, stress may be concentrated on the output lines OL disposed on the base substrate BP in the first areas (e.g., the first areas A-1 of FIG. 3). In order to prevent this, by arranging the adhesive member AM to overlap the entirety of the first areas on the base substrate BP in a plan view, the stress applied to the output lines OL disposed on the base substrate BP in the first areas may be dispersed. Accordingly, the line short-circuited of the chip on film package COF1-1 may not occur.

In an embodiment, the adhesive member AM may be disposed on a surface opposite to a surface on which the lines (e.g., the input lines IL, the output lines OL, etc.) and the driving chip IC are disposed. For example, in case that each of the input lines IL, the output lines OL, and the driving chip IC is disposed on a first surface of the base substrate BP, the adhesive member AM may be disposed on a second surface, opposite to the first surface, of the base substrate BP.

Figure 22:
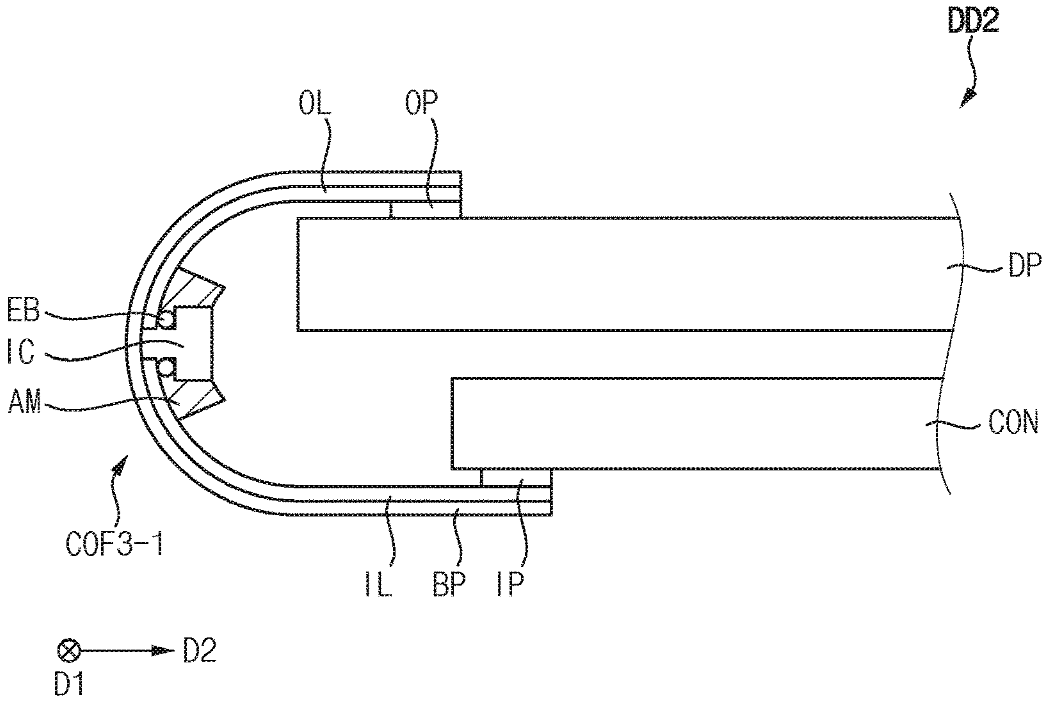
FIG. 22 is a schematic cross-sectional view illustrating a bent shape of a chip on film packaged included in a display device according to another embodiment of the disclosure.

FIG. 22 is a schematic cross-sectional view illustrating a bent shape of a chip on film package included in a display device according to another embodiment of the disclosure. Hereinafter, repetitive descriptions with respect to the display device DD1 described with reference to FIG. 21 will be omitted or simplified.

Referring to FIG. 22, a display device DD2 may include the display panel DP, the chip on film package COF3-1, and the external device CON. The chip on film package COF3-1 may include the base substrate BP, the driving chip IC, the input pad electrodes IP, the output pad electrodes OP, the input lines IL, the output lines OL, the electrode bump EB, and the adhesive member AM.

In case that the chip on film package COF3-1 included in the display device DD2 is bent to position the external device CON on the lower surface of the display panel DP, stress may be concentrated on the output lines OL disposed on the base substrate BP in the first areas. In order to prevent this, by arranging the adhesive member AM to overlap the entirety of the first areas on the base substrate BP in a plan view, the stress applied to the output lines OL disposed on the base substrate BP in the first areas may be dispersed. Accordingly, the line short-circuited of the chip on film package COF3-1 may not occur.

In an embodiment, the adhesive member AM may be disposed on the same surface as the surface on which the lines and the driving chip IC are disposed. For example, in case that each of the input lines IL, the output lines OL, and the driving chip IC is disposed on the first surface of the base substrate BP, the adhesive member AM may be disposed on the first surface of the base substrate BP.

In this case, the adhesive member AM may define an opening exposing the driving chip IC. However, the disclosure is not limited thereto, and the adhesive member AM may be disposed to overlap the entirety of the driving chip IC in a plan view.

The disclosure can be applied to various display devices. For example, the disclosure is applicable to various display devices such as display devices for vehicles, ships and aircraft, portable communication devices, display devices for exhibition or information transmission, medical display devices, and the like.

The above description is an example of technical features of the disclosure, and those skilled in the art to which the disclosure pertains will be able to make various modifications and variations. Thus, the embodiments of the disclosure described above may be implemented separately or in combination with each other.

The embodiments disclosed in the disclosure are intended not to limit the technical spirit of the disclosure but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A chip on film package comprising:
- a base substrate including:
  - a driving chip area including a first side extending in a first direction and a second side facing the first side and extending in the first direction;
  - first areas covering ends of the first side of the driving chip area, spaced apart from each other in the first direction, and including a plurality of first bent portions; and
  - a second area covering the second side of the driving chip area and adjacent to each of the first areas in a second direction intersecting the first direction;
- a driving chip disposed on a first surface of the base substrate in the driving chip area;
- a plurality of output lines electrically connected to the driving chip and disposed on the first surface of the base substrate in the first areas and the second area; and
- an adhesive member disposed on the base substrate and overlapping an entirety of the first areas and an entirety of the driving chip area in a plan view.

2. The chip on film package of claim 1, wherein the adhesive member is disposed on a second surface, opposite to the first surface, of the base substrate.

3. The chip on film package of claim 1, wherein the adhesive member includes a plurality of second bent portions overlapping an entirety of the plurality of first bent portions in the plan view.

4. The chip on film package of claim 1, wherein the adhesive member includes a curved portion overlapping an entirety of the plurality of first bent portions in the plan view.

5. The chip on film package of claim 1, wherein the base substrate further includes:
- a third area adjacent to the first side of the driving chip area between the first areas; and
- fourth areas respectively positioned on both sides of the third area and spaced apart from each other in the first direction.

6. The chip on film package of claim 5, wherein
- the base substrate further includes dummy areas respectively positioned between the first areas and the fourth areas in the plan view and spaced apart from each other in the first direction, and
- the plurality of output lines are spaced apart from the dummy areas in the plan view.

7. The chip on film package of claim 5, further comprising:
- a plurality of input lines electrically connected to the driving chip and disposed on the first surface of the base substrate in the third area; and
- a plurality of gate lines spaced apart from the driving chip and disposed on the first surface of the base substrate in each of the fourth areas, and
- wherein the plurality of gate lines bypass the plurality of output lines.

8. The chip on film package of claim 7, wherein the adhesive member at least partially overlaps the plurality of input lines in the third area in the plan view.

9. The chip on film package of claim 1, wherein the adhesive member is disposed on the first surface of the base substrate.

10. The chip on film package of claim 9, wherein the adhesive member includes an opening exposing the driving chip in the driving chip area.

11. The chip on film package of claim 1, wherein the adhesive member overlaps a part of the second area in the plan view.

12. The chip on film package of claim 1, wherein the adhesive member has an asymmetrical shape with respect to the first side of the driving chip area.

* * * * *